US010581344B2

(12) United States Patent
Cottone et al.

(10) Patent No.: US 10,581,344 B2
(45) Date of Patent: Mar. 3, 2020

(54) MINIATURE KINETIC ENERGY HARVESTER FOR GENERATING ELECTRICAL ENERGY FROM MECHANICAL VIBRATIONS

(71) Applicant: Chambre de Commerce et D'Industrie de Region Paris Ile de France, Noisy le Grand (FR)

(72) Inventors: Francesco Cottone, Tolentino (IT); Philippe Basset, Fontenay Sous Bois (FR)

(73) Assignee: Chambre de Commerce et D'Industrie de Region Paris Ile de France (FR)

( * ) Notice: Subject to any disclaimer, the term of this patent is extended or adjusted under 35 U.S.C. 154(b) by 277 days.

(21) Appl. No.: 15/542,694

(22) PCT Filed: Jan. 8, 2016

(86) PCT No.: PCT/EP2016/050294
§ 371 (c)(1),
(2) Date: Jul. 11, 2017

(87) PCT Pub. No.: WO2016/113199
PCT Pub. Date: Jul. 21, 2016

(65) Prior Publication Data
US 2017/0373611 A1    Dec. 28, 2017

(30) Foreign Application Priority Data

Jan. 16, 2015   (EP) .................................... 15305045

(51) Int. Cl.
*H02N 1/08*     (2006.01)
*B81B 3/00*     (2006.01)
*H02N 1/00*     (2006.01)
*H02N 2/18*     (2006.01)
*B81C 1/00*     (2006.01)
*H02K 35/00*    (2006.01)

(52) U.S. Cl.
CPC ............. *H02N 1/08* (2013.01); *B81B 3/0021* (2013.01); *B81B 3/0051* (2013.01);
(Continued)

(58) Field of Classification Search
CPC .......... H02N 1/08; H02N 1/008; H02N 2/186; H02N 2/188; H02N 2/183; H02N 2/18; B81B 3/00; B81B 3/0018; B81B 3/0021
See application file for complete search history.

(56) References Cited

U.S. PATENT DOCUMENTS 5,578,877 A  * 11/1996  Tiemann ................ B61D 43/00
                                                    290/1 R
6,539,803 B2 *  4/2003  Mochida ............ G01C 19/5719
                                                    73/504.12
(Continued)

FOREIGN PATENT DOCUMENTS

EP          2882092 A1     6/2015

OTHER PUBLICATIONS

International Search Report for Application No. PCT/EP2016/050294 dated Apr. 13, 2016, 3 pages.

*Primary Examiner* — Edgardo San Martin
(74) *Attorney, Agent, or Firm* — Lerner, David, Littenberg, Krumholz & Mentlik, LLP

(57) ABSTRACT

The invention relates to a miniature kinetic energy harvester for generating electrical energy, comprising a support, a first element having walls surrounding at least one cavity, at least one spring mounted between the first element and the support, the spring being arranged so that the first element may be brought into oscillation relative to the support according to at least one direction of oscillation, a transducer arranged between the first element and the support for converting oscillation of the first element relative to the support into an electrical signal, at least one second element housed within the cavity and mounted to freely move within (Continued)

the cavity relative to the first element so as to impact the walls of the cavity when the harvester is subjected to vibrations.

19 Claims, 19 Drawing Sheets

(52) U.S. Cl.
CPC ..... *B81B 3/0062* (2013.01); *B81B 2203/0136* (2013.01); *B81B 2203/0163* (2013.01); *B81B 2203/051* (2013.01); *B81B 2203/055* (2013.01); *B81B 2203/056* (2013.01); *B81C 1/00182* (2013.01); *H02K 35/00* (2013.01); *H02N 2/188* (2013.01)

(56) References Cited

U.S. PATENT DOCUMENTS

| | | | |
|---|---|---|---|
| 7,176,601 B2 * | 2/2007 | Tanaka | H02N 2/183 310/339 |
| 7,258,010 B2 * | 8/2007 | Horning | H02N 1/008 73/504.14 |
| 7,965,016 B2 * | 6/2011 | Despesse | H02N 2/186 310/309 |
| 8,087,186 B2 * | 1/2012 | Rastegar | H02N 2/18 290/1 A |
| 8,129,885 B2 * | 3/2012 | Lee | H02N 2/186 310/324 |
| 8,283,834 B2 * | 10/2012 | Matsubara | H02N 1/08 310/12.01 |
| 8,525,392 B2 * | 9/2013 | Rastegar | H02N 2/186 310/339 |
| 2006/0017353 A1 | 1/2006 | Sakai | |
| 2006/0017363 A1 | 1/2006 | Wei et al. | |
| 2010/0045119 A1 | 2/2010 | Jackson et al. | |
| 2010/0283264 A1 * | 11/2010 | Rastegar | F21L 13/00 290/1 R |
| 2011/0074162 A1 | 3/2011 | Cottone et al. | |
| 2011/0101827 A1 | 5/2011 | Yoon et al. | |
| 2012/0161583 A1 * | 6/2012 | Kang | H02N 2/186 310/339 |

* cited by examiner

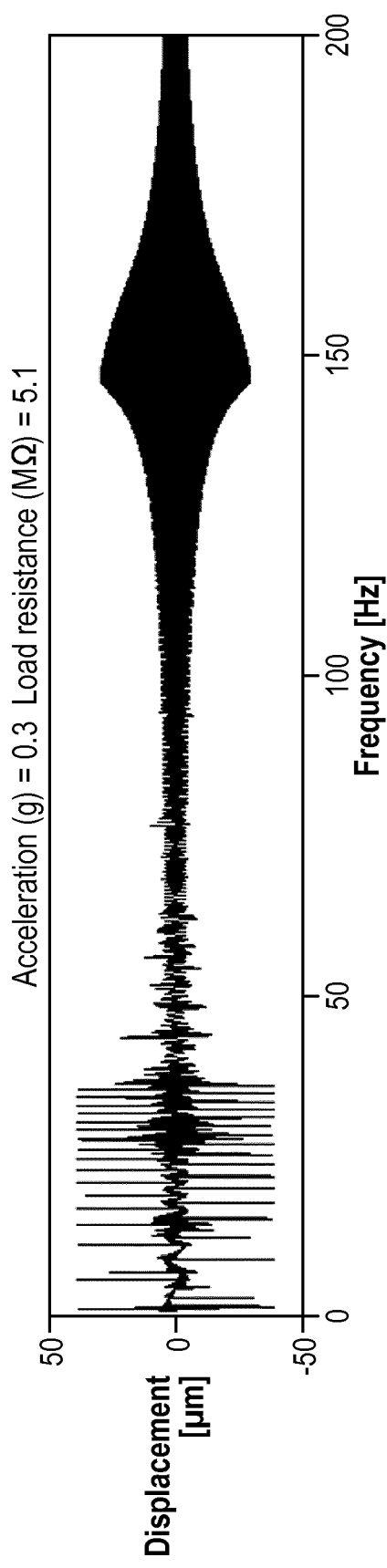
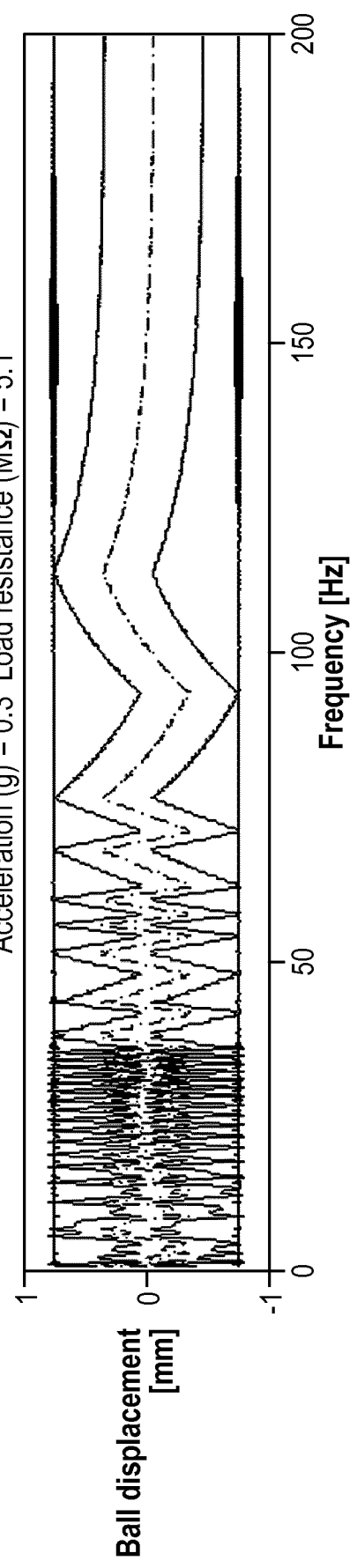
FIG. 7A
FIG. 7B

MINIATURE KINETIC ENERGY HARVESTER FOR GENERATING ELECTRICAL ENERGY FROM MECHANICAL VIBRATIONS

CROSS REFERENCE TO RELATED APPLICATIONS

The present application is a national phase entry under 35 U.S.C. § 371 of International Application No. PCT/EP2016/050294 filed Jan. 8, 2016, published in English, which claims priority from European Patent Application No. 15305045.5 filed Jan. 16, 2015, all of which are incorporated herein by reference.

FIELD OF THE INVENTION

The invention relates to a miniature kinetic energy harvester for generating electrical energy from mechanical vibrations, and to a method for manufacturing the same.

PRIOR ART

Vibration energy harvesters (VEH) are devices that capture vibration energy from the environment and convert it to useful electrical form.

VEH have been recently considered as an interesting alternative to common electrical sources, such as electrochemical batteries or fuel cells, because they are able to operate for very long time without maintenance. Because of their extended life-time, VEH are particularly contemplated for delivering electrical energy to systems requiring low power: such as wireless sensors, RFID tags or medical devices intended to be implanted in the body.

Most miniature VEH having dimensions below 1 centimeter are only capable of operating at fixed frequencies of several hundred of hertz. Indeed, the maximum electrical power, which may be generated by such inertial devices, depends on the matching of the frequency of the mechanical vibrations they are subjected to and the resonance frequency of their transducer. This maximum electrical power drops dramatically at low frequency.

However, mechanical vibrations from natural and artificial sources are inconsistent and mostly located in below 100 Hz.

Document US 2011/0074162 discloses a harvester comprising a housing, a first mass element having a larger mass M1, a second mass element having a smaller mass m2 and spring elements. The first mass element is able to slide relative to the housing along guide rods. The second mass element is also able to slide along the same guide rods within a cavity of the first mass element. Spring elements serve to stop the mass elements at the ends of their range of motion. The second mass element is arranged to receive collisionally transferred kinetic energy from the first mass element when the housing is subjected to mechanical agitation. The second mass element includes a permanent magnet. A coil arranged around the axis of displacement of the first mass element converts the time-varying magnetic flux generated by the displacement of the second element into an output voltage.

The harvester allows transferring energy from the first mass element, which is set into motion at low frequency, to the second mass element, which has a higher natural frequency.

Other patent applications US2011/101827, US2006/017353, US2010/045119 describe some energy harvesting device with piezoelectric material or a magnet, which need elastic deformation or present a complex structure.

However, fabrication of such a harvester may be complex, as it necessitates assembling the different components together. In addition, the harvester may be quite bulky which makes it inappropriate for applications wherein large space is not available.

Accordingly, there is a need for a miniature kinetic energy harvester for generating electrical energy, capable of efficiently converting mechanical vibration at low frequency into useful electrical signal.

SUMMARY OF THE INVENTION

One aim of the invention is to provide a miniature kinetic energy harvester having reduced dimensions, for instance of the order of 1 centimeter square, which may be made up of components having dimensions between 1 to 100 micrometers in size.

Another aim of the invention is to provide a miniature kinetic energy harvester which may be fabricated as a microelectromechanical system (MEMS) using batch fabrication technologies generally used for semiconductor devices.

The invention relates to a miniature kinetic energy harvester for generating electrical energy, comprising:
 a support,
 a first element having walls surrounding at least one cavity,
 at least one spring mounted between the first element and the support, the spring being arranged so that the first element may be brought into oscillation relative to the support according to at least one direction of oscillation,
 a transducer arranged between the first element and the support for converting oscillation of the first element relative to the support into an electrical signal,
 at least one second element housed within the cavity and mounted to freely move within the cavity relative to the first element so as to impact the walls surrounding the cavity, when the harvester is subjected to vibrations.

By "miniature kinetic harvester", it is meant a harvester which has small dimensions, i.e. lower than 2 centimeters. If the device is fabricated by MEMS technologies, the miniature kinetic harvester has a thickness of less than 0.5 centimeter.

The harvester takes advantage of the free movement of the second element housed inside the cavity of the first element to capture low frequency vibrations and transfer kinetic energy to the first element, which in turn oscillates at its natural frequency. By setting the natural frequency of the first element, it is possible to maximize the power of the electrical signal outputted by the transducer.

As the second element is mounted to freely move within the cavity and as the transducer is arranged between the first element and the support, the operations needed for assembling the device are simplified.

In particular, the support, the first element, the spring and the transducer may be made in one operation consisting of etching a single layer of material. The material of the layer may be a semi-conductor material, such as silicon.

The miniature kinetic energy harvester may also have the following features:
 the first element has a first natural frequency of oscillation, and the second element is adapted for being set into motion when the harvester is subjected to vibrations having a second frequency of oscillation, which is lower than the first natural frequency, the transducer is a MEMS transducer, the miniature kinetic energy harvester comprises elastic stoppers arranged between the support and the first element for limiting travel of the first element according to its direction of oscillation, the elastic stoppers comprise non-linear springs, the walls surrounding the cavity are made in the mass of the first element, the miniature kinetic energy harvester comprises elastic stoppers arranged between the first element and the second element for limiting travel of the second element relative to the first element, the elastic stoppers are made in the walls surrounding the cavity, the cavity has rectilinear walls so as to guide the second element along the direction of oscillation, the cavity has curved walls so as to guide the second element along a circular path, the first element may be brought into oscillation relative to the support according to at least two direction of oscillation, the miniature kinetic energy harvester comprises a bottom cover and a top cover fixed to the support so as to form a housing enclosing the first element, the spring, the second element and the transducer, each of the bottom cover and the top cover has a surface forming a recess, so that the bottom cover and the top cover are not in contact with the first element, the spring and the transducer, the transducer is an electrostatic transducer comprising a capacitor having a first electrode fixed to the support and a second electrode fixed to the first element, and wherein oscillation of the first element relative to the support causes oscillation of the second electrode relative to the first electrode e thereby causing variation of a capacitance of the capacitor, the second electrode is separated from the first electrode by a gap and oscillation of the second electrode relative to the first electrode causes variation of the gap between the electrode, the first electrode has a first area and the second electrode has a second area facing the first area of the first electrode, and oscillation of the second electrode relative to the first electrode causes variation of the areas facing each other, the first and the second electrodes are arranged such that oscillation of the second electrode relative to the first electrode varies both the gap and the overlapping areas, thereby causing variation of the capacitance of the capacitor, for instance with a triangular shape of the electrode the first and second electrodes have a fractal shape, the first and second electrodes comprise an insulating material (i.e. $SiO_2$, Teflon-based, CYTOP . . . ) which may be permanently charged to obtain an electret for creating an electrostatic attractive force between the electrodes, the support surrounds the first element, the spring is a non-linear spring, the spring is a linear spring, the spring can include a piezoelectric material which may be activated for creating a pre-stress on the first element for starting the harvester, the second element is a ball, the second element is rectangular, the transducer is an electromagnetic transducer, the transducer is a piezoelectric transducer, at least two dimensions of the cavity are greater than a dimension of the second element so that the second element is displaced in at least two directions of oscillations, the cavity is circular, the first element comprises two cavities, and the device comprises two second element, each second element being housed within one respective cavity, the device comprises a plurality of springs mounted between the support and the first element.

the support, the first element, the spring and the transducer are made in a semi-conductor materiel, such as silicon.

The invention also relates to a method for manufacturing the kinetic energy harvester, comprising steps of:

forming a mask on a semi-conductor layer, etching the semi-conductor layer through the mask, so as to form the support, the first element, the spring and the transducer, introducing the second element into the cavity of the first element.

The method may also comprise steps of:

fixing a bottom cover and a top cover on the support, so as to form a housing enclosing the first element, the spring, the second element and the transducer.

The method may also comprise steps of:

pumping air from the housing so as to lower pressure inside the housing.

The method may also comprise a step of:

etching the bottom cover and the top cover so as to create a surface with a recess on each of the bottom cover and top cover, so that the bottom cover and the top cover are not in contact with the first element, spring and transducer, once the top cover and bottom cover are fixed to the support.

The invention also relates to a method for generating electrical energy using the kinetic energy harvester, comprising steps of:

shaking the kinetic energy harvester at a first frequency, so that the second element collides with the first element, causing the first element to oscillate relative to the support at a second frequency, and collecting the electrical signal outputted by the transducer, said electrical signal resulting from oscillation of the first element relative to the support.

BRIEF DESCRIPTION OF THE DRAWINGS

FIGS. 7A to 7D are diagrams showing respectively simulations of the amplitude of displacement of the first element, amplitude of displacement of the second element, capacitance of the transducer, and voltage of the output electrical signal, according to the frequency of the mechanical vibrations.

DESCRIPTION OF A PREFERRED EMBODIMENT

Figure 1:
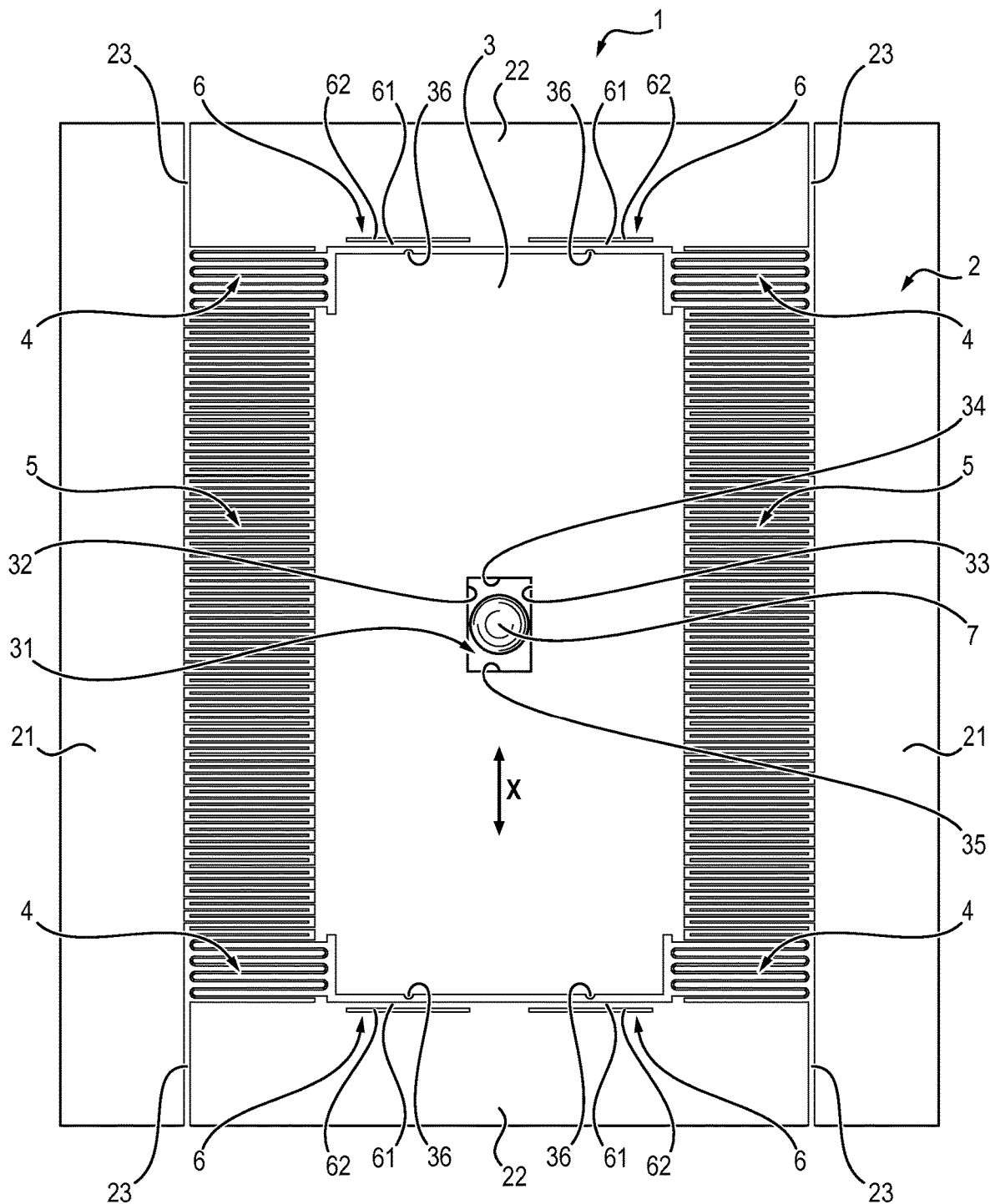
FIG. 1 schematically shows a miniature kinetic energy harvester having a gap-closing electrode transducer according to a first embodiment of the invention.

FIG. 1 schematically shows a miniature kinetic energy harvester 1 according to a first embodiment of the invention. The miniature kinetic energy harvester 1 comprises a support 2, a first element 3, springs 4, electrostatic transducers 5 and elastic stoppers 6.

The support 2 has a shape of a frame and surrounds the first element 3, the springs 4, the electrostatic transducers 5 and the elastic stoppers 6. The support 2 comprises two longitudinal bars 21 and two transversal bars 22

The longitudinal bars 21 and the transversal bars 22 are separated from each other by gaps 23 in order to avoid electrical short-circuit between them.

The first element 3 has a general rectangular shape with four corners. The first element 3 has a cavity 31 which may be formed for instance at the center of the first element 3.

The cavity 31 is a slot made in the layer of the first element. The slot 31 is for instance rectangular in shape and is delimited by two longitudinal walls 32, 33 extending in a longitudinal direction of the first element 3 and two transversal walls 34, 35 extending in a transversal direction of the first element 3.

The first element 3 also comprises four protrusions 36 projecting from transversal sides of the first element 3.

The miniature kinetic energy harvester 1 comprises four springs 4 suspending the first element 3 to the support 2.

Each spring 4 has a shape of a serpentine.

Each spring 4 extends between a transversal bar 22 of the support 2 and a corner of the first element 3.

The springs 4 are arranged so that the first element 3 is movable relative to the support 1 according to one direction of oscillation X. The direction of oscillation X is parallel to the longitudinal bars 21 of the support 2.

The first element 3 and the springs 4 form a mass-spring system having a natural frequency of oscillation.

The miniature kinetic energy harvester 1 comprises two electrostatic transducers 5.

Figure 2:
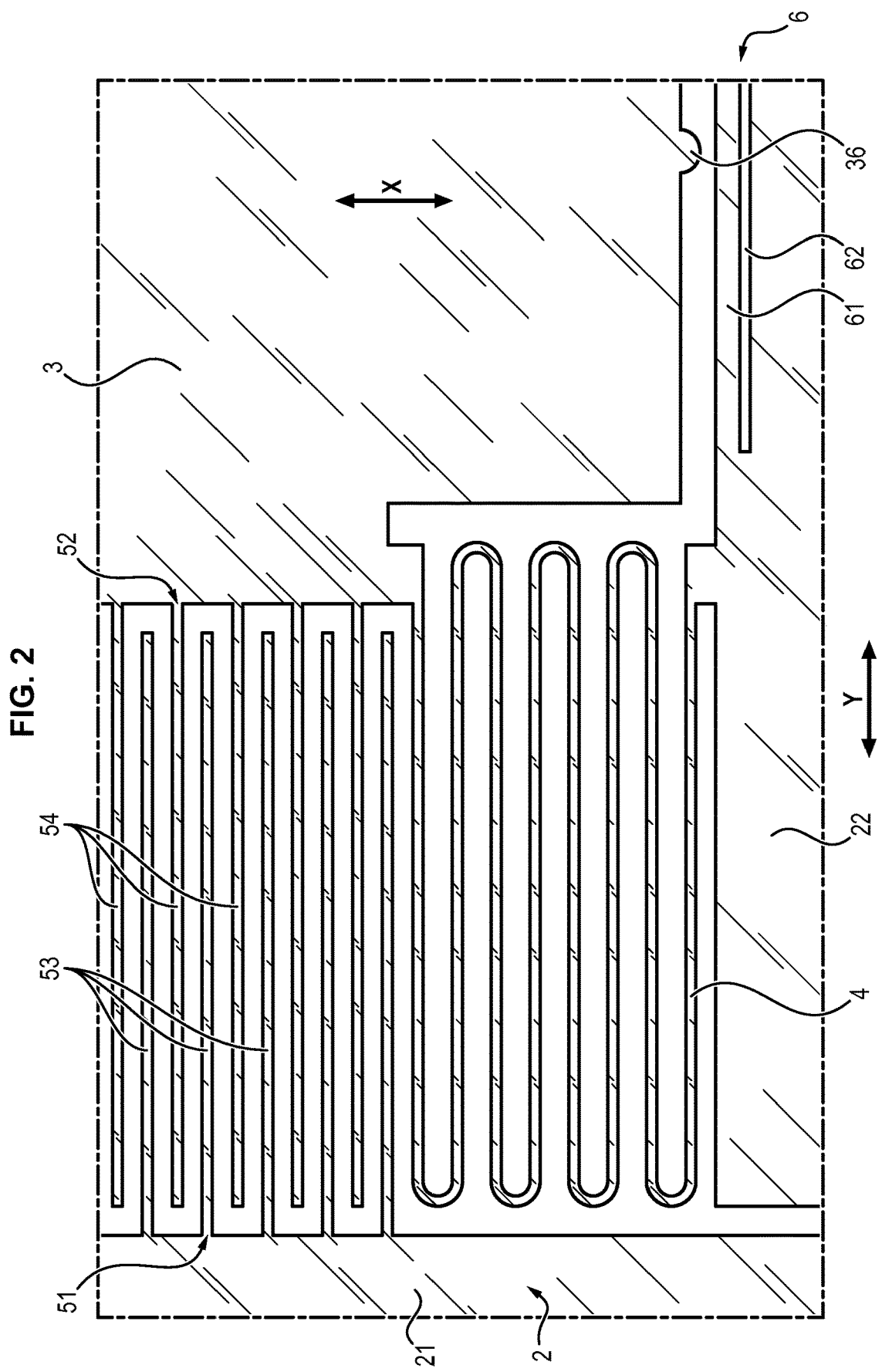
FIG. 2 is a detailed view of the miniature kinetic energy harvester of FIG. 1.

As shown on FIG. 2, each electrostatic transducer 5 comprises a first comb 51 (or fixed comb) fixedly mounted relative to the support and a second comb 52 (or mobile comb) fixedly mounted relative to the first element.

The first comb 51 has a plurality of first fingers 53 extending perpendicularly relative to the direction X of oscillation of the first element 3.

The second comb 52 has a plurality of second fingers 54 also extending perpendicularly relative to the direction X of oscillation of the first element 3.

The first comb 51 and the second comb 52 are interdigitated, which means that the second fingers 54 extend in between the first fingers 53. The first fingers 53 and the second fingers 54 are spaced from each other by a gap. In this way, the first comb 51 and the second comb 52 form two electrodes of a capacitor.

Oscillation of the first element 3 relative to the support 2, in the direction X, causes oscillation of the first comb 51 relative to the second comb 52 in a direction perpendicular to the fingers, thus causing variation of the gap existing between the first fingers 53 and the second fingers 54, thus causing variation of the capacitance of the capacitor.

As illustrated on FIG. 1, the second element 7 is positioned inside the cavity 31 of the first element 3.

The second element 3 is a ball, made of metal, such as for instance tungsten. The ball 3 has a diameter which is slightly lower than the width of the cavity 31 so that the ball 3 is able to freely move within the cavity 31 relative to the first element 3.

The longitudinal walls 32, 33 of the cavity 31 are oriented so as to guide the ball 3 along a direction which is collinear to the direction X of oscillation of the first element 3.

The miniature kinetic energy harvester 1 comprises four elastic stoppers 6 arranged between the support 2 and the first element 3 for limiting travel of the first element 3 relative to the support 2.

Figure 3:
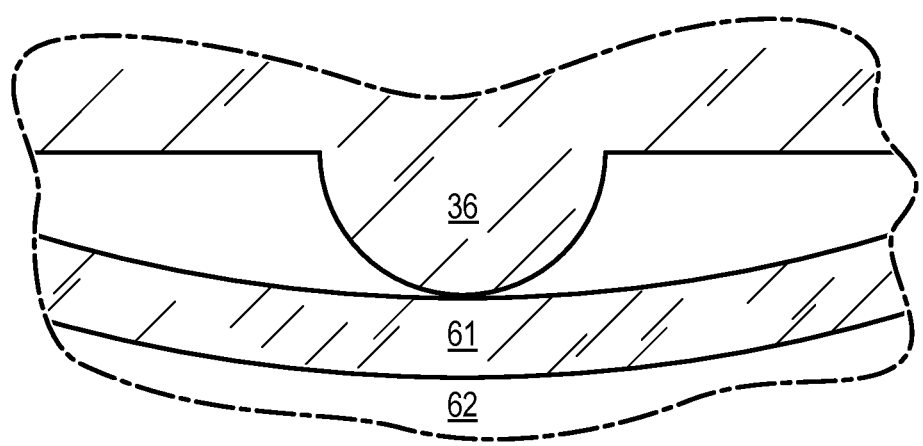
FIG. 3 is a schematic view of an elastic stopper.
Figure 4A:
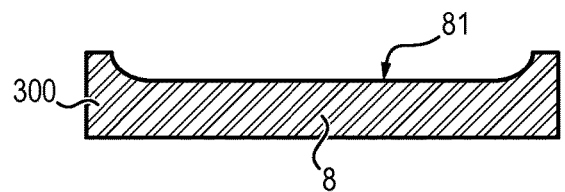
FIGS. 4A to 4G illustrates different steps of a method for fabricating the miniature kinetic energy harvester of FIG. 1.
Figure 4E:
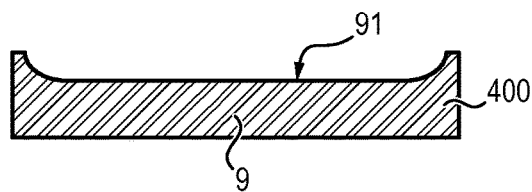
Figure 4B:
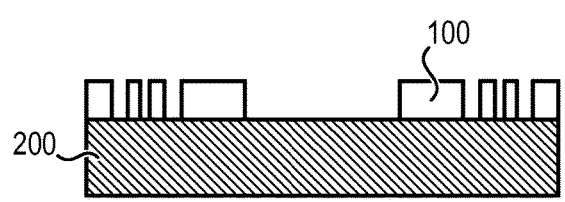
Figure 4F:
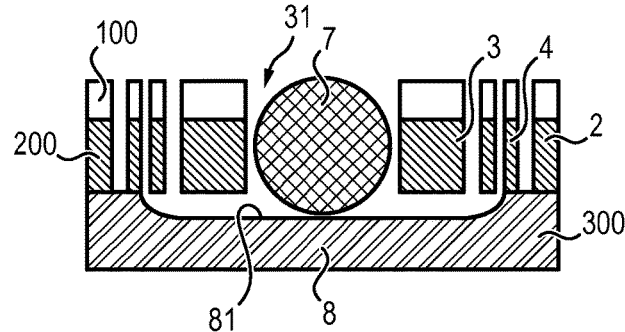
Figure 4C:
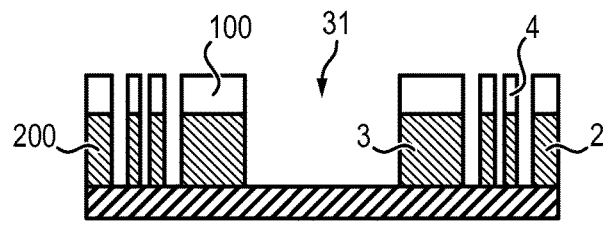
Figure 4D:
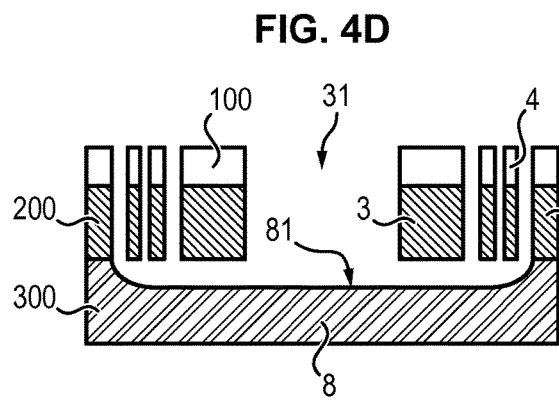
Figure 4G:
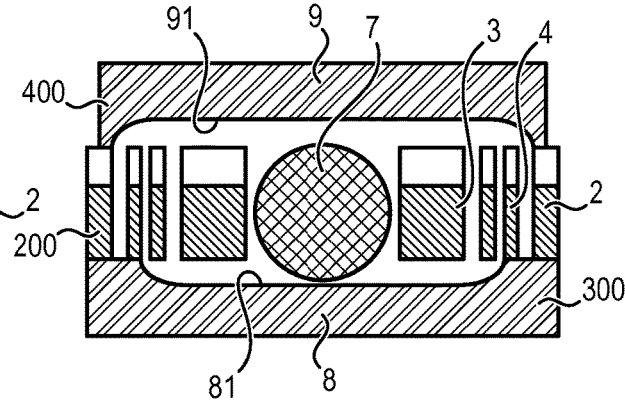

As illustrated on FIGS. 2 and 3, each elastic stopper 6 faces a corresponding protrusion 36 formed on the first element 3.

Each elastic stopper 6 comprises a beam 61 formed in the support 2. The beam 61 has two ends fixedly connected to the support 2. The beam 61 extends along a direction which is transversal to the direction X of oscillation of the first element 3.

The beam 61 may be obtained by providing a slot 62 in the layer of semi-conductor, the slot 62 extending along a side of the transversal bar 22.

When the first element 3 oscillates relative to the support 2, the protrusion 36 of the first element 3 may bump into the beam 61.

Each time the protrusion 36 bumps into the beam 61, the protrusion 36 urges the beam 36 towards the support 2, causing the beam 61 to bend elastically.

Because of its elasticity, the beam 61 generates a return force which opposes the movement of the first element 3. As a result, the elastic stoppers 6 amplify the first element velocity.

The miniature kinetic energy harvester 1 also comprises a bottom cover 8 and a top cover 9 fixed to the support 2 so as to form a housing enclosing the first element 3, the springs 4, the transducers 5, the elastic stoppers 6 and the second element 7.

Each of the bottom cover 8 and the top cover 9 has an inner surface forming a respective depression 81 and 91, so that the bottom cover 8 and the top cover 9 are not in contact with the first element 3, the springs 4, the transducers 5 and the elastic stoppers 6.

The bottom cover 8 and the top cover 9 prevent the ball 7 from escaping from the cavity 31 of the first element 3.

The bottom 8 and top 9 covers are made of an insulator material such as glass. They are bonded to the bar 21 and the bar 22 in order to form a rigid frame on which the support 2 is attached.

The two parts 23 and 24 of the support 2 are separated by air gaps 25, 26 to avoid electrical connection between the first comb 51 and the second comb 52.

In use, when the miniature kinetic energy harvester 1 is shaken at low frequency (below 60 Hz), the second element 7 is set into motion into the cavity 31 and alternatively impacts the walls 34 and 35 of the cavity 31. The second element 7 thereby transfer kinetic energy to the first element 3, which in turns oscillates relative to the support. The first element 3 oscillates at the natural frequency of the mass-spring system. In addition, the first element 3 collides with the support via the elastic stoppers 6.

The elastic stoppers 6 amplify the velocity of the first element 3 and that of the second element 7. The electrostatic transducers 5 convert oscillation of the first element 3 relative to the support 2 into an output electrical signal which may be further use to supply power to electronic devices.

FIGS. 4A to 4G illustrates different steps of a process for fabricating the miniature kinetic energy harvester 1.

According to a first step (FIG. 4A), the bottom cover 8 is formed by etching a first glass wafer 300 so as to create a recess 81 in the glass wafer. The first glass wafer 300 may be etched by liquid or vapor hydrofluoric acid (HF) or reactive ion etching (RIE).

According to a second step (FIG. 4B), a mask 100 is deposited on a layer 200 of conductor. The layer 200 of conductor is for instance a layer of doped silicon having a thickness typically between 200 micrometers and 2 millimeters. The mask 100 defines a pattern with openings delimiting shapes of components of the harvester to be formed in the layer of semi-conductor. The mask 100 may be made of thick photoresist or thin film of metal, like aluminum (Al), chromium (Cr) or nickel (Ni) for instance.

According to a third step (FIG. 4C), the conductor layer 200 is etched through the mask 100, preferably by deep reactive-ion etching (DRIE) for doped silicon layer. The conductor layer 200 is etched through its entire thickness. This third step leads to the formation of the components of the harvester, i.e. the support 2, the first element 3, the springs 4, the electrostatic transducers 5 and the elastic stoppers 6.

According to a fourth step (FIG. 4D), the conductor layer 200 is assembled to the bottom cover 8, preferably by anodic bonding. More precisely, the bottom cover 8 is fixed to the support 2 of the harvester, so that the other components, i.e. the first element 3, the springs 4, the electrostatic transducers 5 and the elastic stoppers 6, extend above the recess 81 and are not in contact with the bottom cover 8.

According to a fifth step (FIG. 4E), the top cover 9 is formed by etching a second glass wafer 400 by a double side mask process so as to create a recess 91 in the glass wafer. The second glass wafer may be etched by liquid or vapor hydrofluoric acid (HF) or by high frequency reactive ion etching. The top cover needs a double mask process to etch throughout the entire thickness four through holes of rectangular shape for allowing wires bonding with four electrode pads.

According to a sixth step (FIG. 4F), the ball 7 is inserted inside the cavity 31 of the first element 3. Insertion of the ball 7 may be made using a pick-and-place machine.

According to a seventh step (FIG. 4G), the top cover 9 is assembled to the conductor layer 200, preferably by anodic bonding so that a vacuum can be obtained between both covers to reduce air damping. The top cover 9 may also be glued to the conductor layer 200 by acrylic glue. The top cover 9 is fixed to the support 2 of the harvester 1, so that the other components, i.e. the first element 3, the springs 4, the electrostatic transducers 5 and the elastic stoppers 6, extend below the recess 91 and are not in contact with the top cover 9. The conductor layer 200 is thus sandwiched between the bottom cover 8 and the top cover 9.

The bottom cover 8 and the top cover 9 form a housing which protects the components of the harvester 1 and prevents the ball 7 from escaping from the cavity 31 of the first element 3.

In the process illustrated on FIGS. 4A to 4G, the component of the harvester, i.e. the components of the harvester, i.e. the support 2, the first element 3, the springs 4, the electrostatic transducers 5 and the elastic stoppers 6 are obtained by etching one single layer of a conducting material.

Alternatively, the electrostatic transducer 5 could be made in two different layers. In particular, the electrostatic transducer 5 may have one electrode made in a first layer of material, and a second electrode made in a second layer of material.

FIGS. 4A to 4G illustrate a process for fabricating the miniature kinetic energy harvester as a microelectromechanical system (MEMS) using batch fabrication technologies generally used for semiconductor devices. Alternatively, the miniature energy harvester could be made by laser machining of a metal plate, Focused Ion Beam Micromachining or 3D printing.

Example

Figure 5:
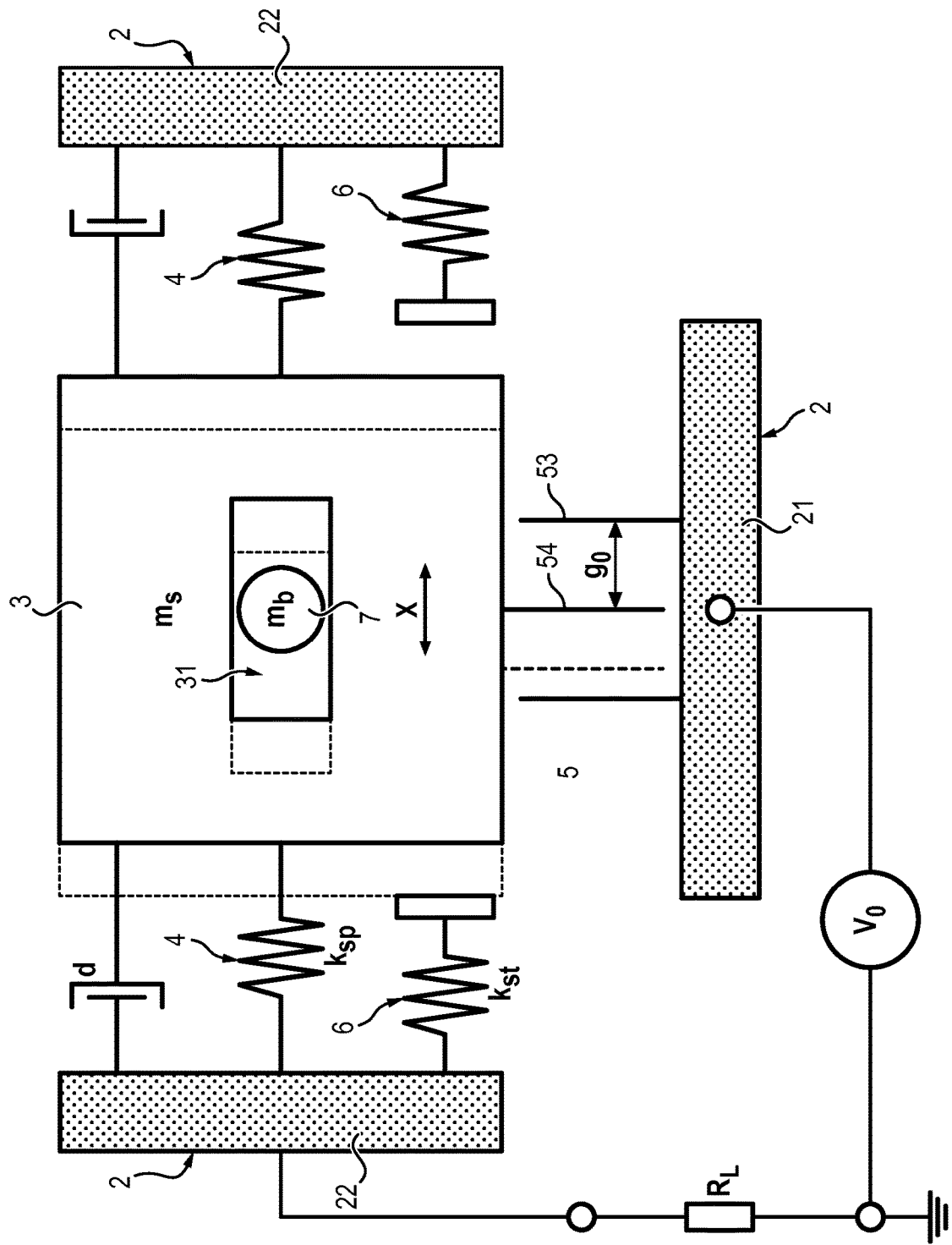
FIG. 5 is a schematic model of the miniature kinetic energy harvester of FIG. 1 with a conditioning circuit.

FIG. 5 is a schematic model of the miniature kinetic energy harvester 1 of FIG. 1.

The parameters of the model are the following:
$m_s$ is the mass of the first element,
$m_b$ is the mass of the second element,
$k_{sp}$ is the stiffness of the springs,
$k_{st}$ is the stiffness of the elastic stoppers,
$g_0$ is the gap between fingers of the capacitor,
d is the damping coefficient of mass-spring system.

The miniature kinetic energy harvester is pre-charged at a constant voltage $V_0$ and the output power is dissipated across a variable load resistance $R_L$ connected in series.

The first element 3 is suspended to the support 2 by serpentine springs 4 having a thickness of 20 μm. The comb capacitor is pre-charged by an initial bias voltage $V_0$ that span from 10 to 20 V. The second element 7, a tungsten carbide micro-ball of 0.8 mm of diameter, is housed inside the first element 3 within a rectangular cavity 31 that measures 1 mm of width by 1.5 mm of length.

When the system vibrates at frequency below 60 Hz, the micro-ball 7 freely moves within the cavity 31 and impacts on the upper and lower inner wall 34 and 35 of the first element 3. Each collision provides a wideband mechanical impulse to the first element 3. The first element in turns resonates at its natural frequency that is usually above 100 Hz. In this way, kinetic energy of the input vibration is transferred from low frequencies, below 2-60 Hz, to higher frequencies, in the range of 92-120 Hz. The operation bandwidth of such a mechanical frequency-up conversion depends on the ball travelling distance and on the deflection height of the beams of the elastic stoppers 6. The cavity length of this prototype is designed such that the maximum rate of impacts occurs around 15-20 Hz for a given acceleration of 0.3 g (where g=9.81 ms$^{-1}$). Based on calculations on the system model, a length of the ball cavity of 7 mm would optimize the harvester for operation at 2 Hz. This configuration has a great potential for capturing energy from human movements. This is useful, for example, to recharge the battery of a pacemaker.

Silicon beams 61 (60-μm-thick, 2 mm of length) of the stoppers 6 allow quite good elastic impact of the first element 3 with the support 2. The calculated equivalent spring stiffness of the stoppers 6 at midpoint results $k_{st}$=2.71×10$^4$ N/m, while the stiffness of the serpentine springs 4 along the moving direction X results $k_{sp}$=19 N/m for the experimental MEMS prototype and 68 N/m for the simulated model. The overall die surface measures about 10×10 mm$^2$. The comb fingers 53 and 54 have a length of 2 mm, width of 30 μm and an initial gap $g_0$ of 70 μm in between. Table 1 shows the system parameters.

A miniature kinetic energy harvester prototype was tested onto an electromagnetic shaker that provided mechanical vibrations (TMS, model K2007E01 with integrated power amplifier). The vibration input was generated and handled by a vibration controller (Brüel & Kjr) through the feedback of an accelerometer. The miniature kinetic energy harvester was pre-charged at constant voltage $V_0$ (5-20 V) and the output power was dissipated across a variable load resistance $R_L$ (1 kΩ–0.5 MΩ) connected in series.

All the signals were then recorded through a data acquisition card (National Instruments, model USB-6211) handled with a PC with a LabView program.

The miniature kinetic energy harvester was initially characterized with both simulations and experimental testing for identifying the model parameters that are listed in Table 1. Subsequently, preliminary tests under sine sweeping for input acceleration $a_i$=0.3 g rms and different bias voltage $V_0$=5-20 V were performed. All the measures were carried out comparing the system behavior both with and without the tungsten micro-ball 7.

TABLE 1

Model parameters for the miniature kinetic energy harvester

| Parameters | Value |
| --- | --- |
| Mass of the first element, $m_s$ | 57.2 × 10$^{-6}$ Kg |
| Stiffness of the springs, $k_{sp}$ | 19 Nm$^{-1}$ (exp); 68 Nm$^{-1}$ (sim) |
| Mechanical resonance, $f_r$ | 92 Hz (exp); 150 Hz (sim) |
| Mass of the micro-ball, $m_b$ | 33.5 × 10$^{-6}$ Kg |
| Stiffness of the elastic stoppers, $k_{st}$ | 2.71 × 10$^4$ Nm$^{-1}$ |
| Active area, $A_0$ | 10 × 10 mm$^2$ |
| Gap between fingers of the capacitor, $g_0$ | 70 μm |
| Optimal load resistance, $R_{opt}$ | 5.6 MΩ |
| Semi-conductor layer thickness, $t_d$ | 400 μm |
| Fingers length, $l_f$ | 2 mm |
| Fingers width, $w_f$ | 30 μm |

The term "exp" in Table 1 refers to a value of a parameter the fabricated device detailed in the example.

The term "sim" in Table 1 refers to a value of a parameter used in the simulations illustrated on FIGS. 7 to 11.

Figure 6:
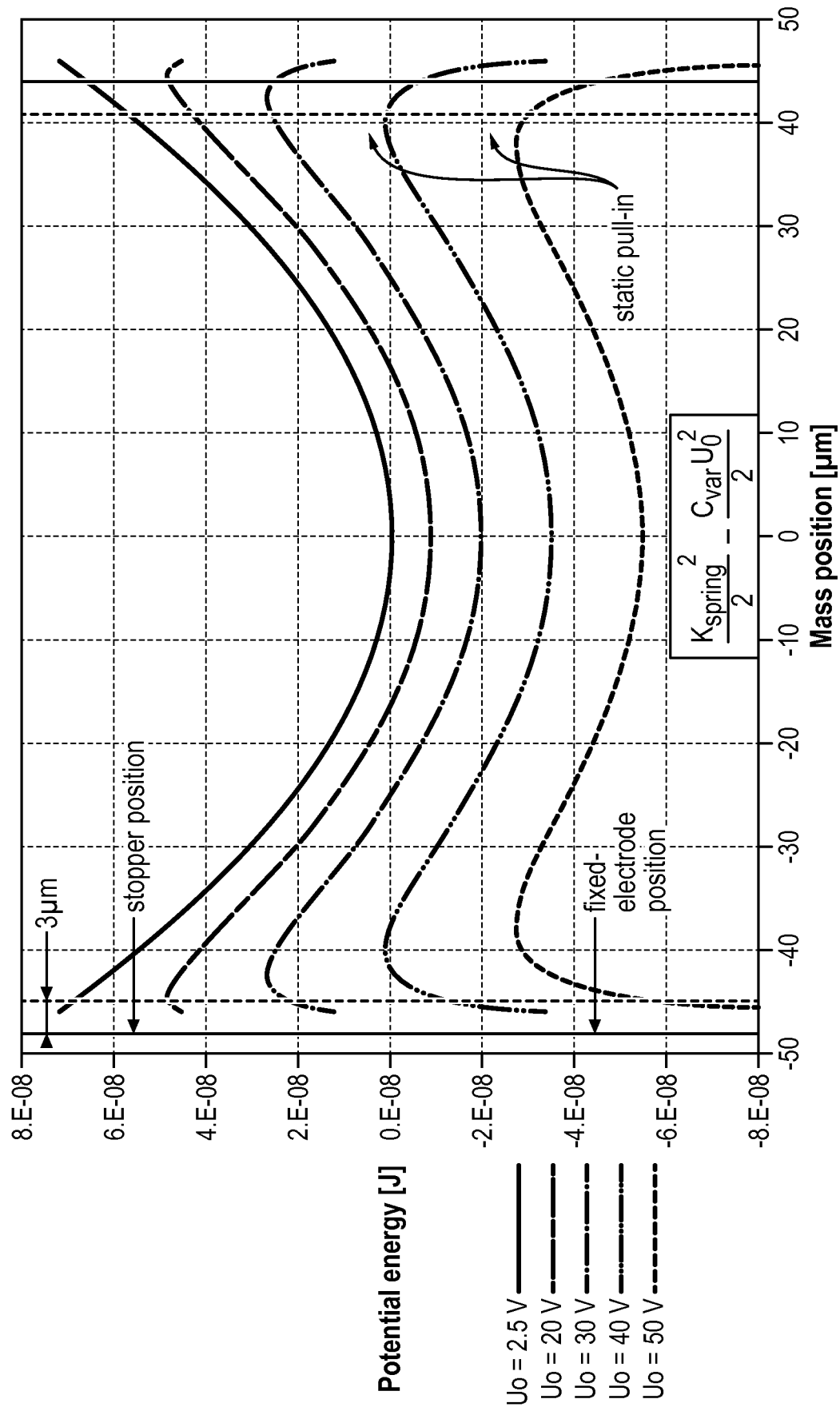
FIG. 6 is a diagram showing a potential energy of the miniature kinetic energy harvester according to a position of the first element, for different external bias voltages.

FIG. 6 is a diagram showing a potential energy of the miniature kinetic energy harvester according to a position of the first element 3 (silicon mass), for different external bias voltages $U_0$.

FIG. 7A is a diagram showing simulation of the amplitude of displacement of the first element under a sine sweeping mechanical vibration from 1 Hz to 200 Hz within 5 seconds of time.

FIG. 7B is a diagram showing positions of the inner wall of the cavity (upper and lower solid curves) and displacement of the micro-ball under the sine sweeping mechanical vibration. The three central curves show the displacement of the ball: dashed middle curve shows the center of the ball, upper and lower curves show the borders of the ball. The first upper and last lower curves show the position of the cavity walls of the first element respectively.

Figure 7C:
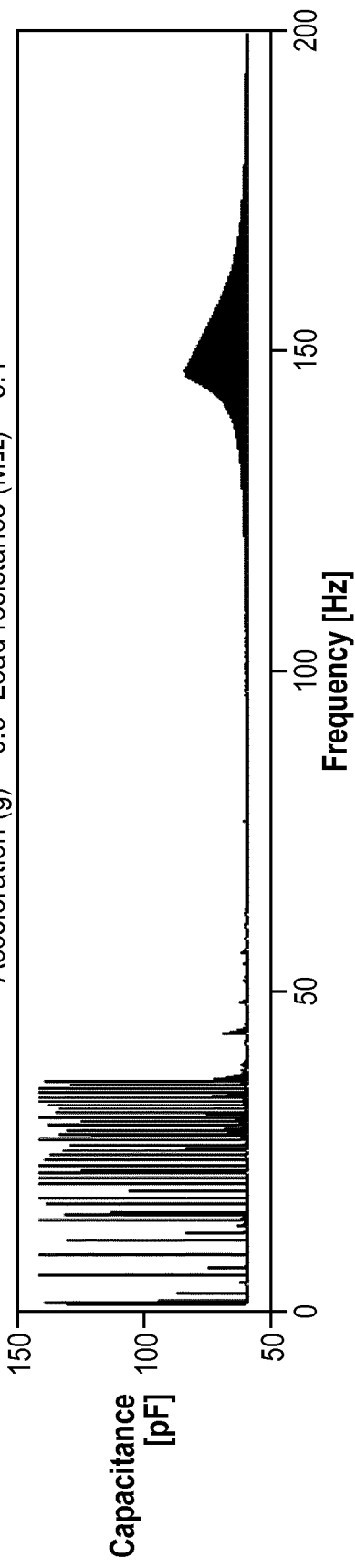

FIG. 7C is a diagram showing capacitance variation of the transducer under the sine sweeping mechanical vibration.

Figure 7D:
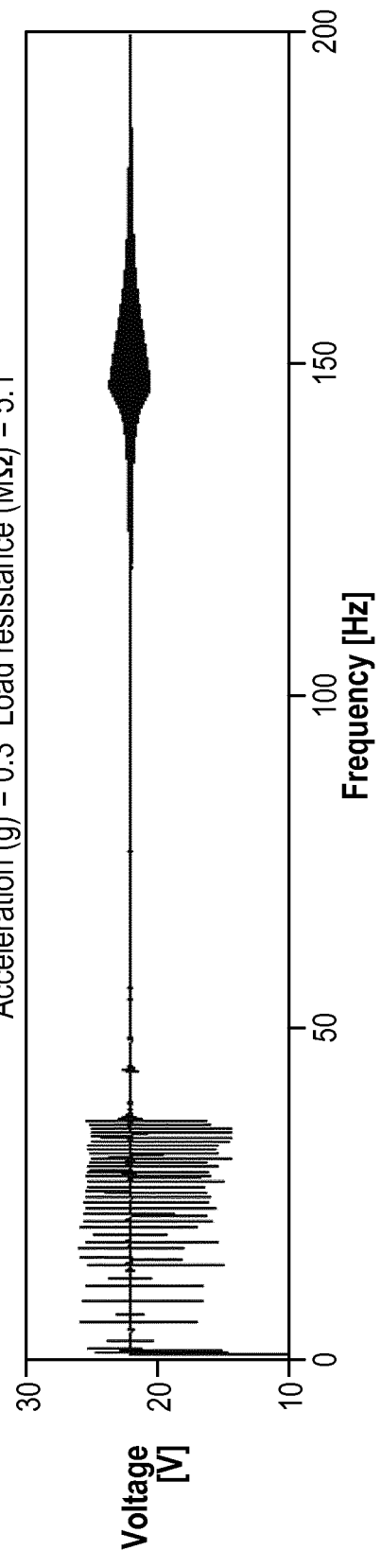

FIG. 7D is a diagram showing the voltage of the corresponding output electrical signal.

It can be noted that at low frequency, in the interval of 2-20 Hz, the micro-ball oscillates with large displacement while the vibrations of first element are almost negligible at the beginning. The micro-ball impacts rate with inner walls of the cavity increases with increasing frequency from 2 Hz up to 40 Hz. In this interval, the micro-ball transfers most of its kinetic energy to the oscillating first element throughout impacts with inner walls of the cavity. At each impact, the first element oscillates at larger frequency (around its resonance). Then, from 40 Hz to 200 Hz the impact rate of the micro-ball decreases, while the oscillation amplitude of the first element increases because the frequency of the input vibration is approaching the resonant frequency of the first element.

Figure 8:
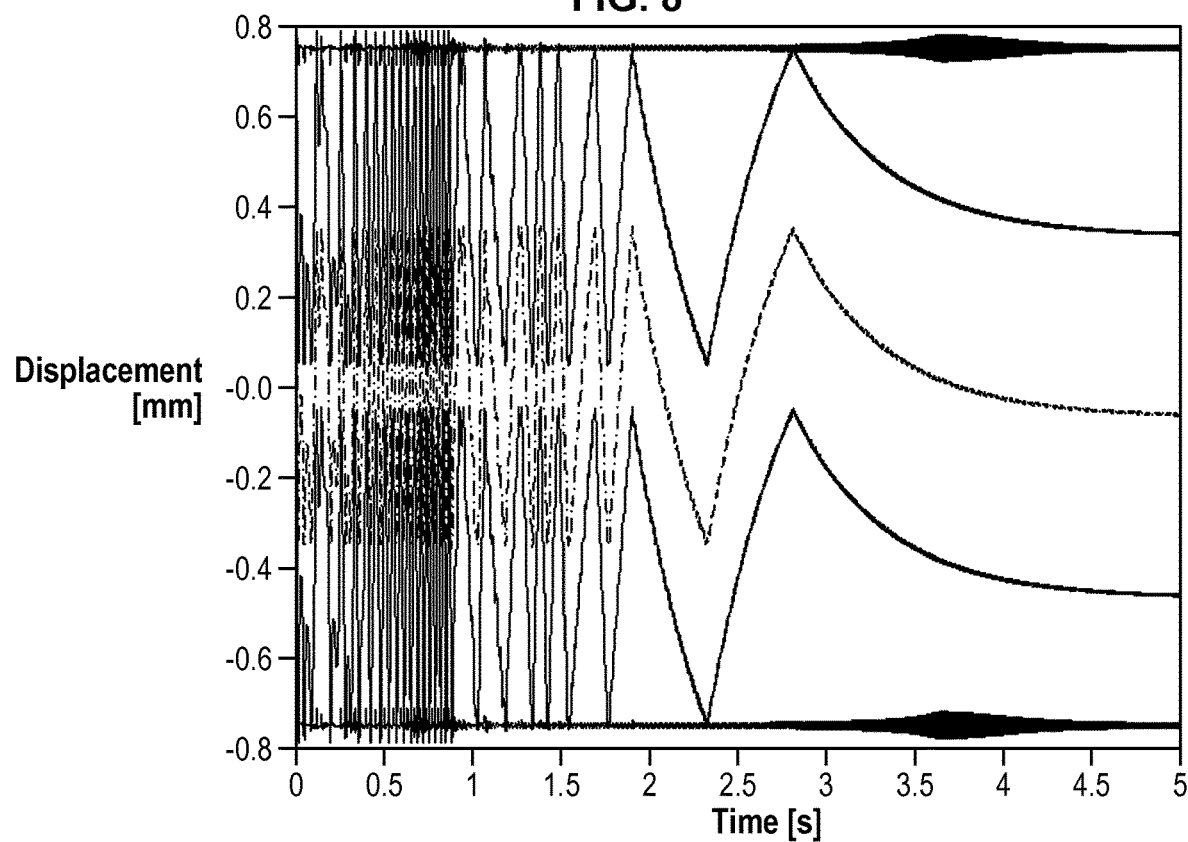
FIG. 8 is a diagram showing amplitudes of displacement of the first element and amplitude of displacement of the second element inside the cavity of the first element, according to the frequency of the mechanical vibrations.

FIG. 8 is a diagram showing amplitudes of displacement of the first element and amplitude of displacement of the micro-ball according to the frequency of the mechanical vibrations. Time interval of 0-5 s corresponds to the frequency sweeping of 0-200 Hz. The three central curves show the displacement of the ball: dashed middle curve shows the center of the ball, upper and lower curves show the borders of the ball. The first upper and last lower curves show the position of the cavity walls of the first element respectively.

Figure 9:
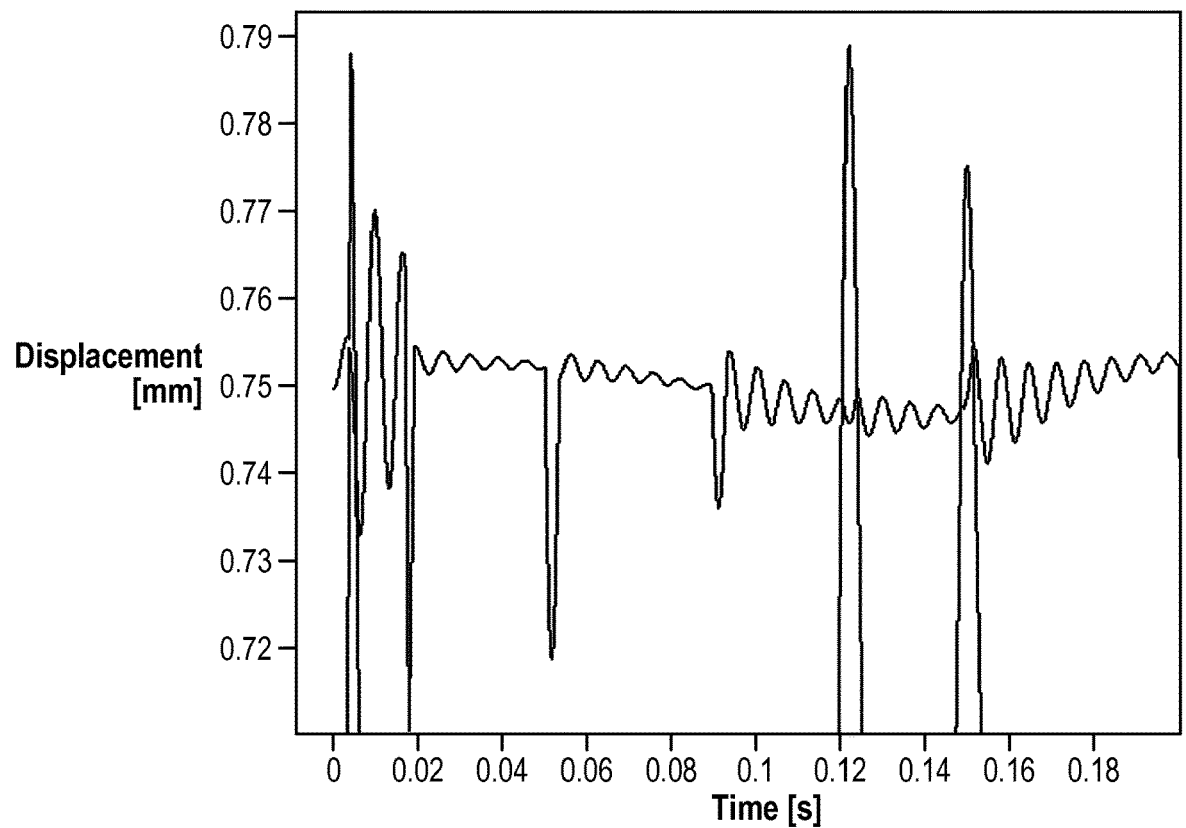
FIG. 9 is an enlarged view of a part of the diagram of FIG. 8 and shows the displacement of the first element (upper cavity wall) during impact with the second element.

FIG. 9 is a diagram showing amplitudes of displacement of the first element and amplitude of displacement of the micro-ball according to the time and is an enlarged view of a part of the diagram of FIG. 8. It can be observed that after each impact of the micro-ball, the first element resonates at its natural frequency (150 Hz).

Figure 10:
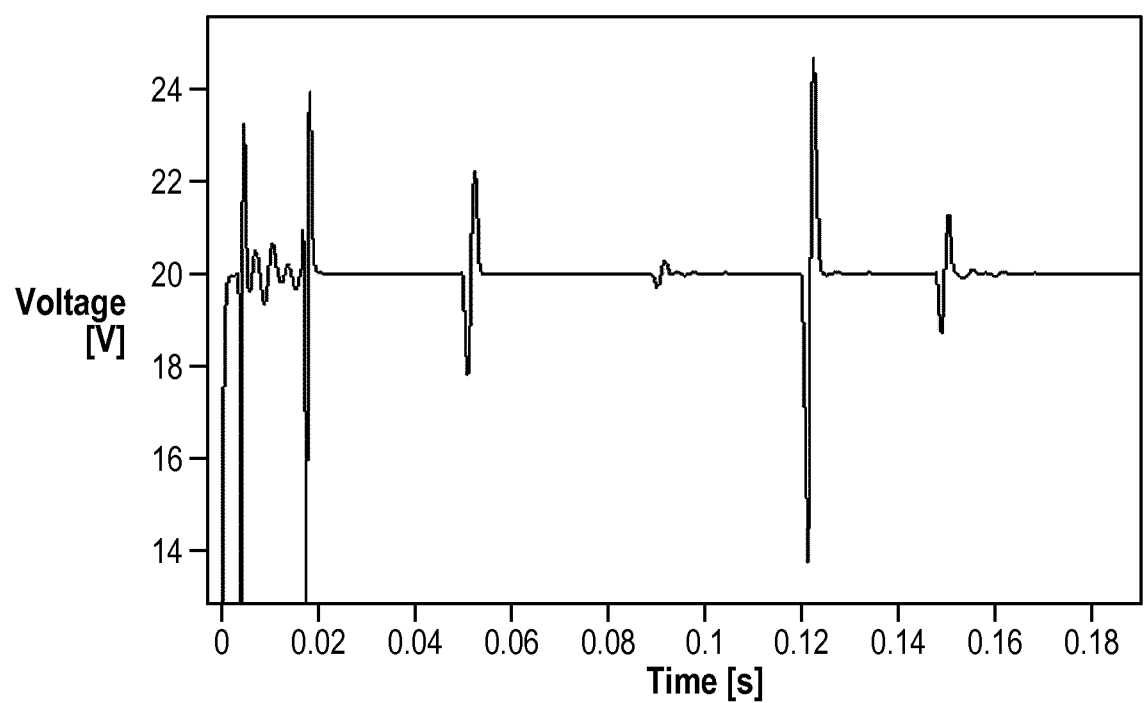
FIG. 10 is the corresponding voltage of the output electrical signal.

FIG. 10 is the corresponding voltage of the output electrical signal. The mechanical movement of the first element is converted by the electrostatic transducer into voltage variation.

Figure 11A:
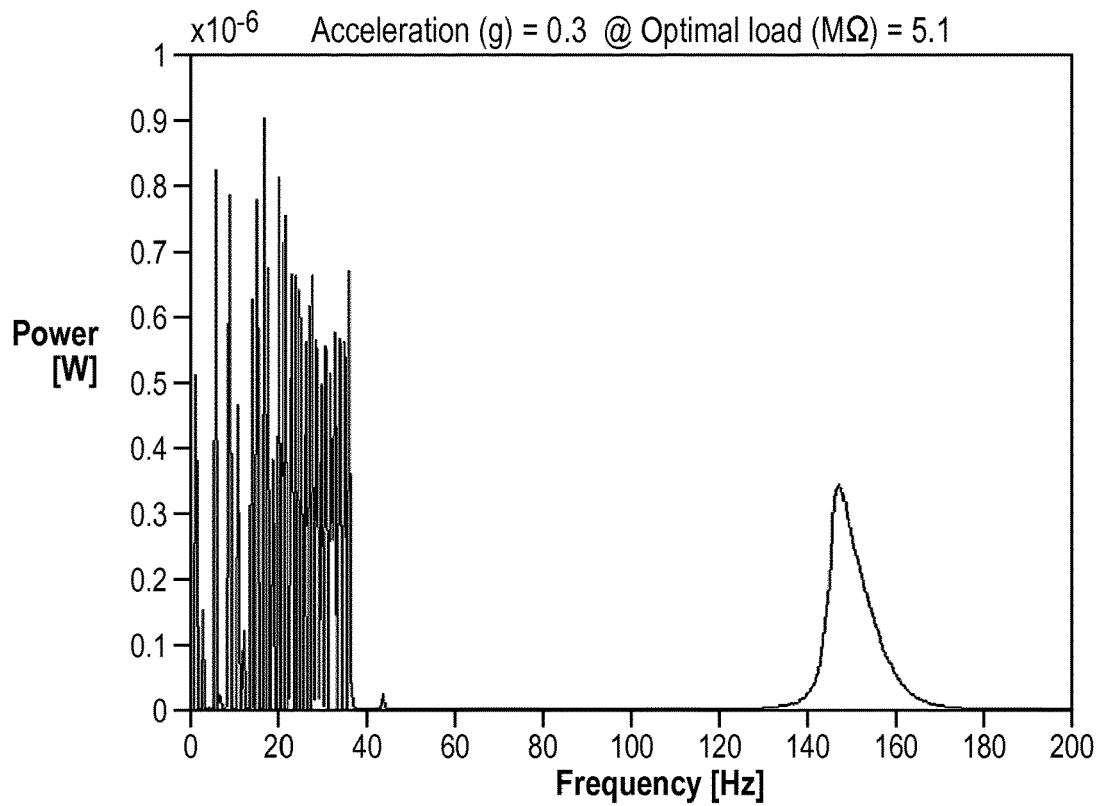
FIG. 11A is a diagram showing the electrical power generated by the miniature kinetic energy harvester according to the frequency of the mechanical vibrations.

FIG. 11A is a diagram showing the electrical power generated by the miniature kinetic energy harvester according to the frequency of the mechanical vibrations.

Power is generated by the impacting micro-ball in the range of frequency comprised between 1 Hz and 40 Hz, and by the resonant first element around its natural frequency (150 Hz).

Figure 11B:
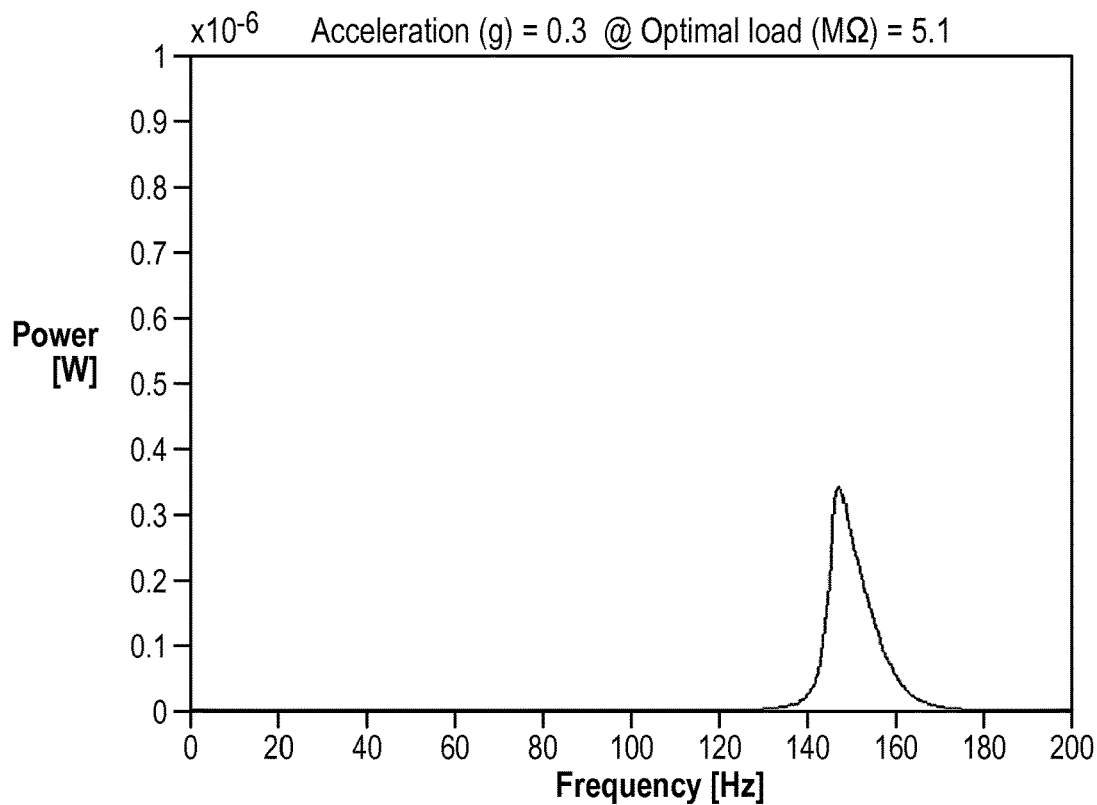
FIG. 11B is a diagram showing the electrical power generated by the same miniature kinetic energy harvester according to the frequency of the mechanical vibrations, without the second element.

FIG. 11B is a diagram showing the electrical power generated by the same miniature kinetic energy harvester according to the frequency of the mechanical vibrations, without the micro-ball.

No power is generated in the range of frequency comprised between 1 Hz and 40 Hz.

Other Possible Embodiments

Figure 12:
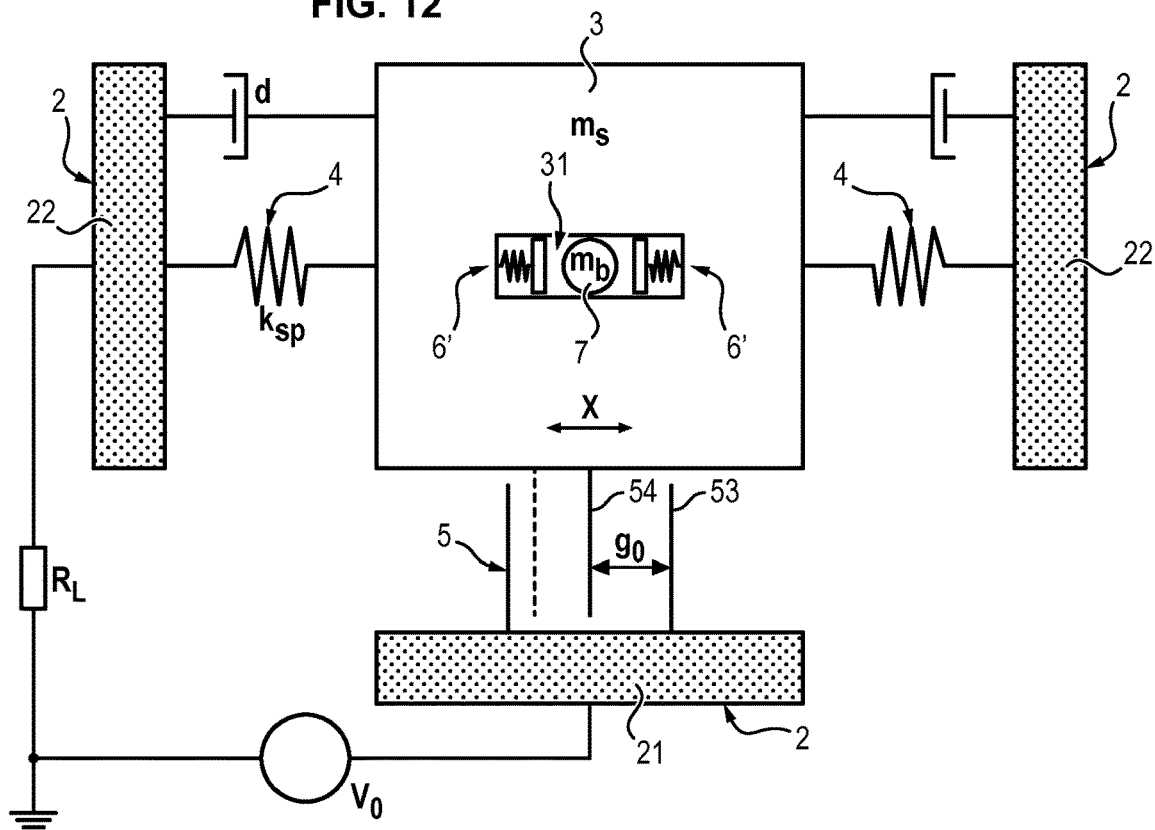
FIG. 12 is a schematic diagram showing a miniature kinetic energy harvester according to a second embodiment of the invention.

FIG. 12 is a schematic diagram showing a miniature kinetic energy harvester 1 according to a second embodiment of the invention.

According to this second embodiment, elastic stoppers 6' are arranged between the first element 3 and the second element 7 for amplification of speed and for expansion of the bandwidth.

The elastic stoppers 6' comprise beams formed in the first element 3. The beams are positioned at both ends of the cavity 31 and extend transversally relative to the direction of travel of the first element 7 within the cavity 31. Each beam may be obtained by providing a slot in the layer of conductor, the slot extending along a transversal wall 34, 35 of the first element 3.

In this case, the equivalent stiffness of the stopper is expressed by the following formula:

$$K_{st} = \frac{16Ewh^3}{L^3} \quad (1)$$

where E is the Young's modulus, w, h and L are the width, thickness and length of the beam along the axis perpendicular to the motion.

The elastic stoppers can be made as elastic beams by etching slots in the first element 3 near cavity walls 24 and 35 as in the support 2.

Figure 13:
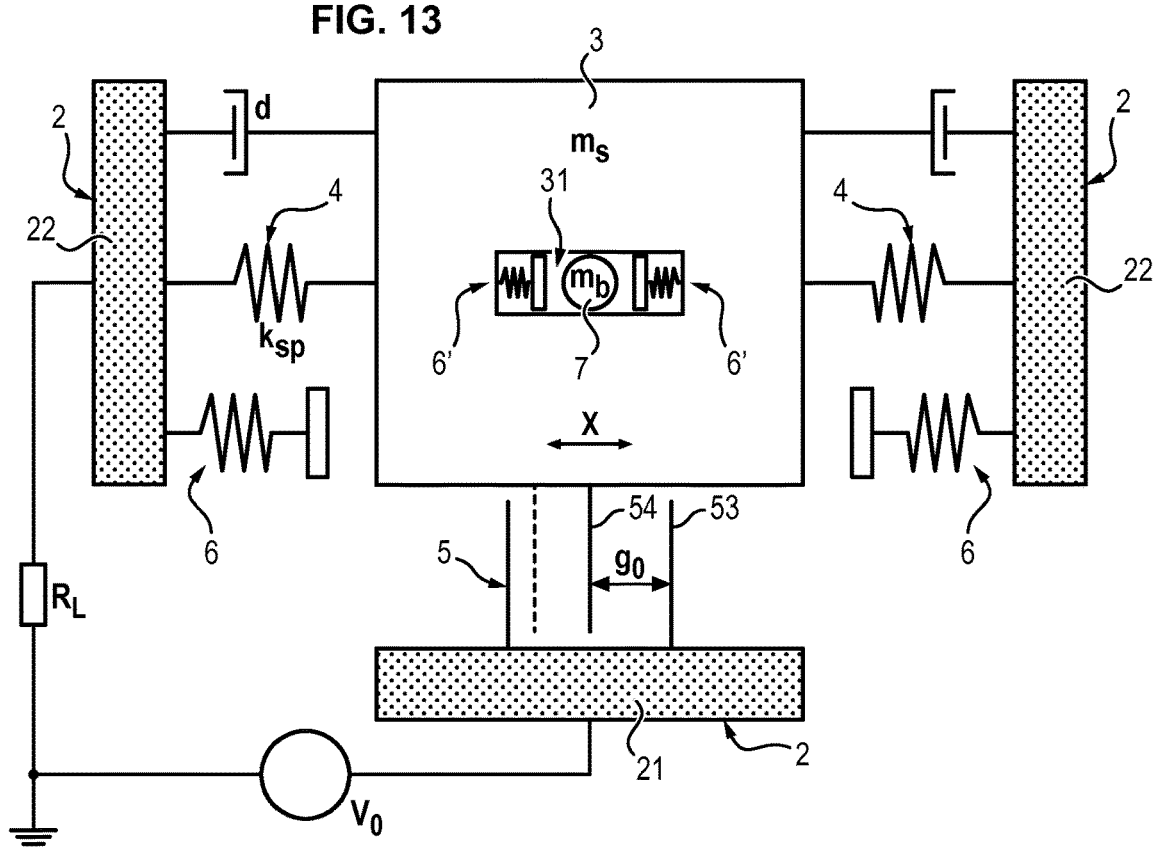
FIG. 13 is a schematic diagram showing a miniature kinetic energy harvester according to a third embodiment of the invention.

FIG. 13 is a schematic diagram showing a miniature kinetic energy harvester 1 according to a third embodiment of the invention.

According to this third embodiment, first elastic stoppers 6 are arranged between the support 2 and the first element 3 and second elastic stoppers 6' are arranged between the first element 3 and the second element 7.

Figure 14:
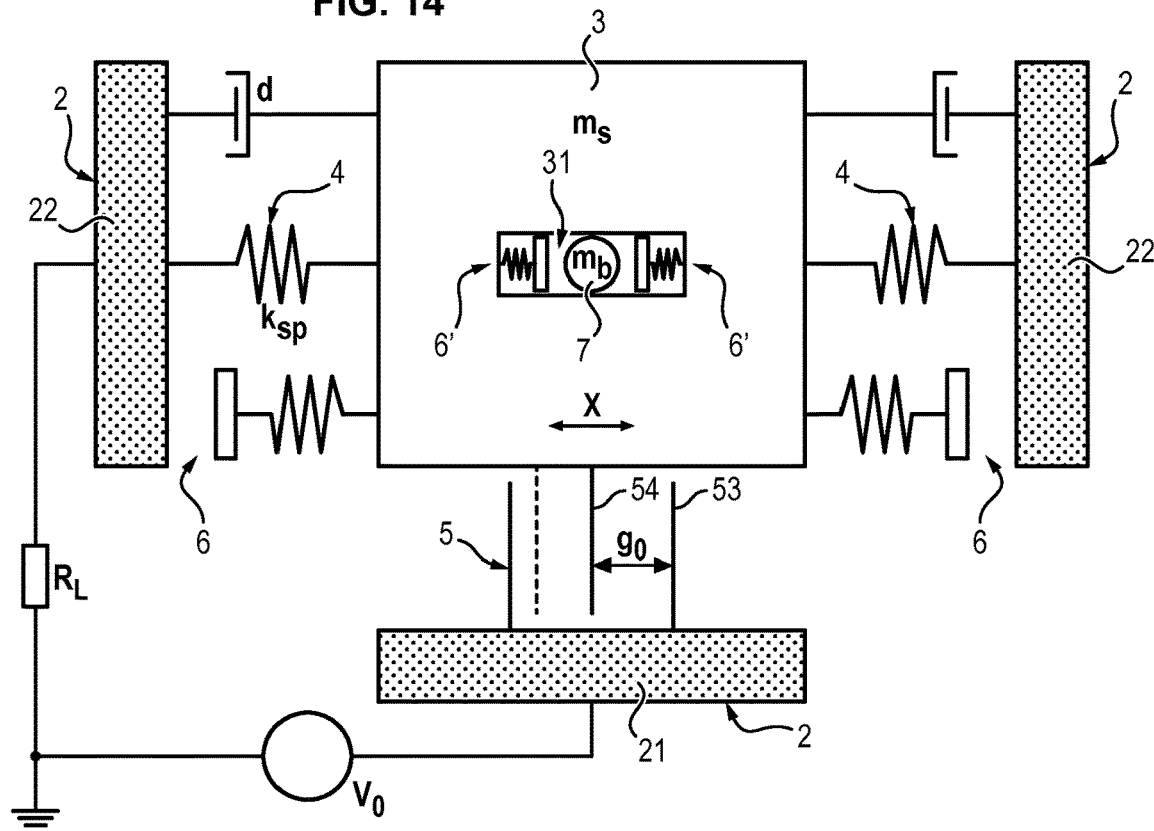
FIG. 14 is a schematic diagram showing a miniature kinetic energy harvester according to a fourth embodiment of the invention.

FIG. 14 is a schematic diagram showing a miniature kinetic energy harvester 1 according to a fourth embodiment of the invention.

According to this fourth embodiment also, first elastic stoppers 6 are arranged between the support 2 and the first element 3 and second elastic stoppers 6' are arranged between the first element 3 and the second element 7.

However, the first elastic stoppers 6 are formed in the first element 3, instead of the support 2. The second elastic stoppers 6' are identical to the elastic stoppers of the second embodiment formed in the first element 3.

Figure 15:
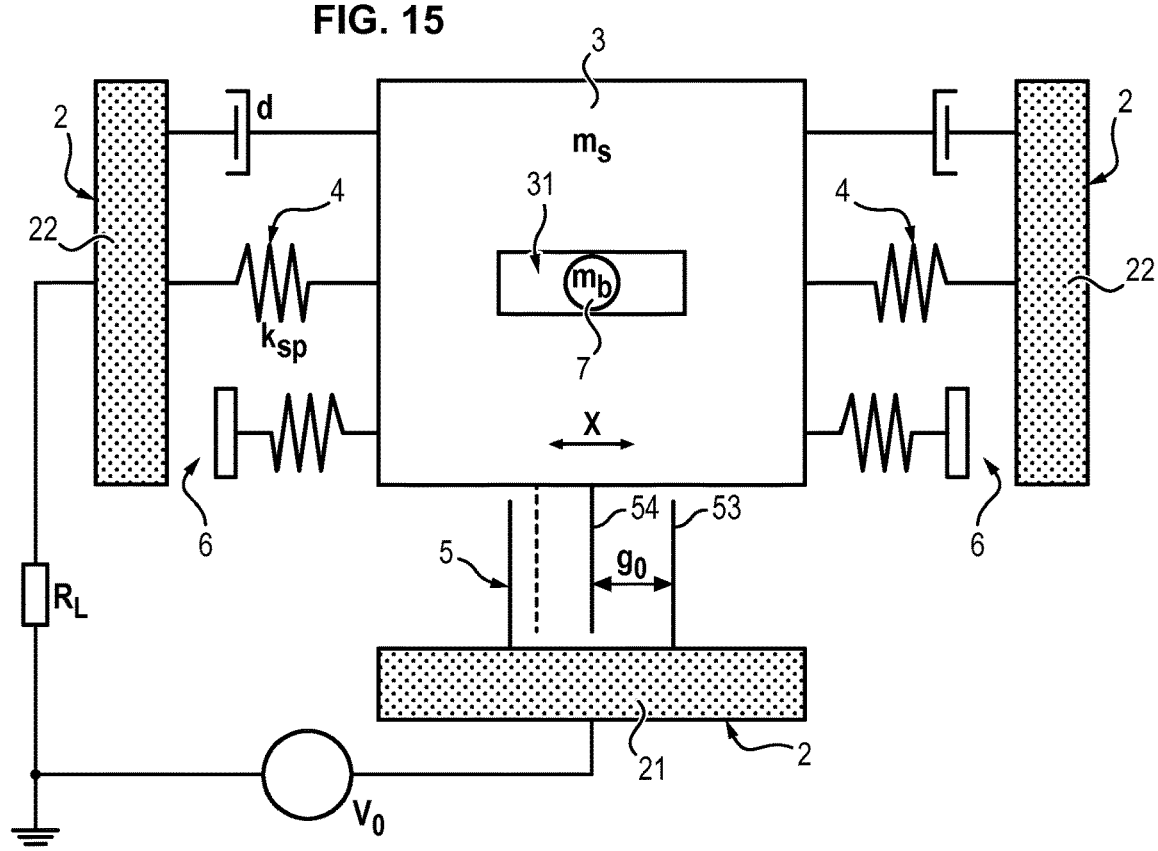
FIG. 15 is a schematic diagram showing a miniature kinetic energy harvester according to a fifth embodiment of the invention.

FIG. 15 is a schematic diagram showing a miniature kinetic energy harvester 1 according to a fifth embodiment of the invention.

According to this fifth embodiment, elastic stoppers 6' are arranged between the support 2 and the first element 3. The elastic stoppers 6 are identical to the elastic stoppers of the fourth embodiment formed in the first element 3.

Figure 16:
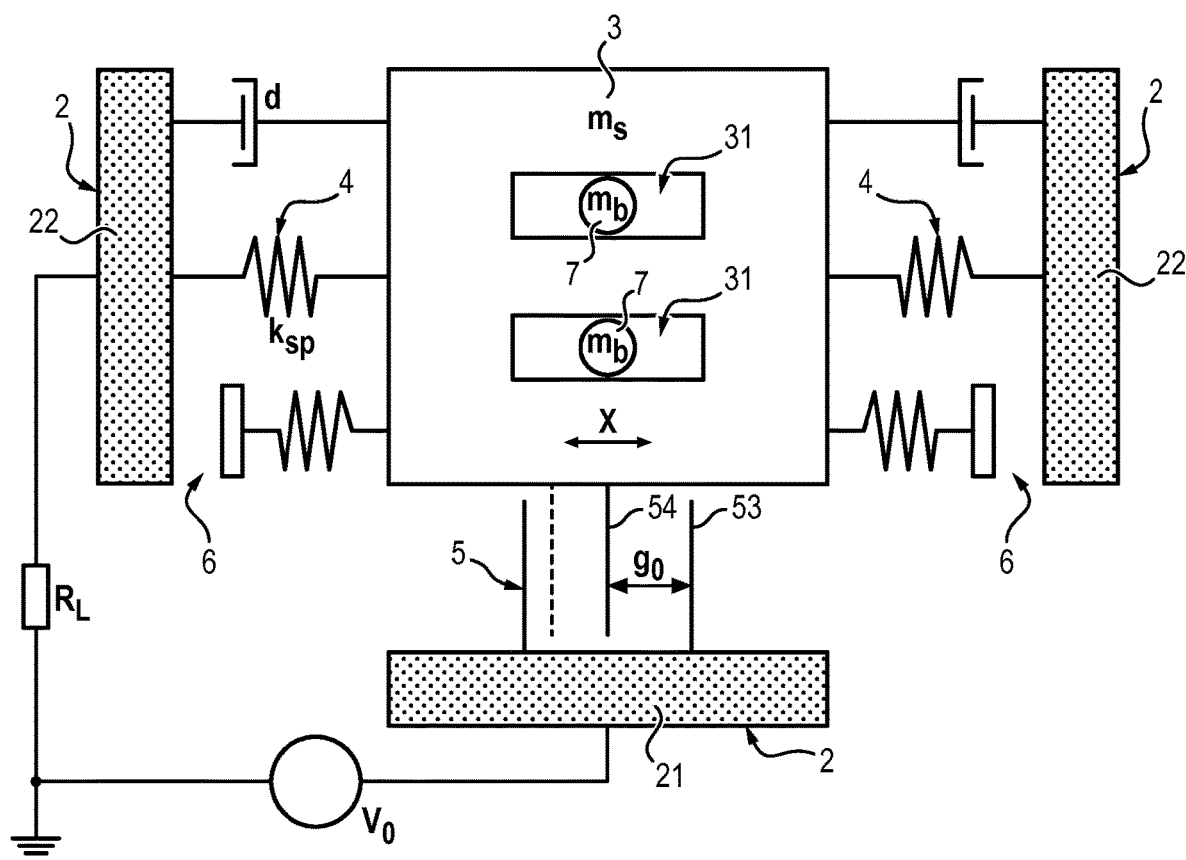
FIG. 16 is a schematic diagram showing a miniature kinetic energy harvester according to a sixth embodiment of the invention.

FIG. 16 is a schematic diagram showing a miniature kinetic energy harvester 1 according to a sixth embodiment of the invention.

According to this sixth embodiment, the miniature kinetic energy harvester 1 comprises a first element 3 having two cavities 31 and two second elements 7. Each second element 7 is housed in a respective cavity 31 of the first element 3 and is mounted to freely move within the cavity 31 relative to the first element 3. It is to be noted that the miniature kinetic energy harvester may have more than two cavities.

In this sixth embodiment, the weight of the first element decreases by increasing the number of cavities, whereas, the second element has in principle a higher density than that of the first element. Therefore, the device resonant frequency may be made higher and the corresponding generated power is larger as it goes as the cube of the resonance frequency. In addition, the second elements (microballs) have more kinetic energy at low frequency and during impact, they transfer more of this kinetic energy to the first element.

Each cavity 31 is rectilinear. The cavities 31 may be parallel to each other and oriented for guiding the second elements 7 according to a direction of motion which is parallel to the direction X of oscillation of the first element 3.

Figure 17:
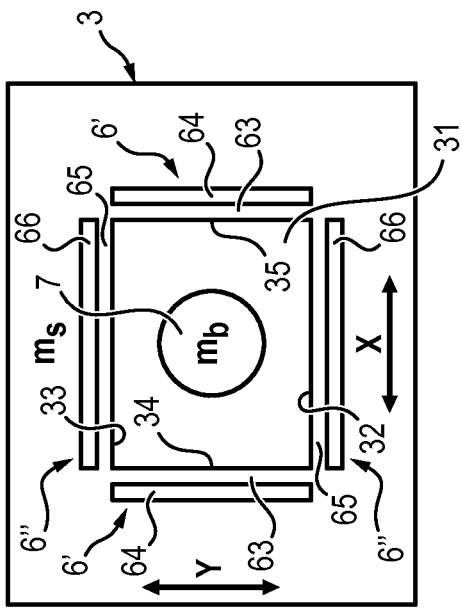
FIGS. 17 to 21 are schematic views of different cavities and elastic stoppers.

FIGS. 17 to 21 are schematic views of different cavities and elastic stoppers,

FIG. 17 illustrates two elastic stoppers 6' arranged between the first element 3 and the second element 7.

The elastic stoppers 6' comprise beams 63 formed in the first element 3. The beams 63 are positioned at both ends of the cavity 31 and extend transversally relative to the direction X of travel of the first element 7 within the cavity 31. Each beam 63 may be obtained by providing a slot 64 in the layer of conductor, the slot extending along a transversal wall 34, 35 of the first element 3.

Figure 18:
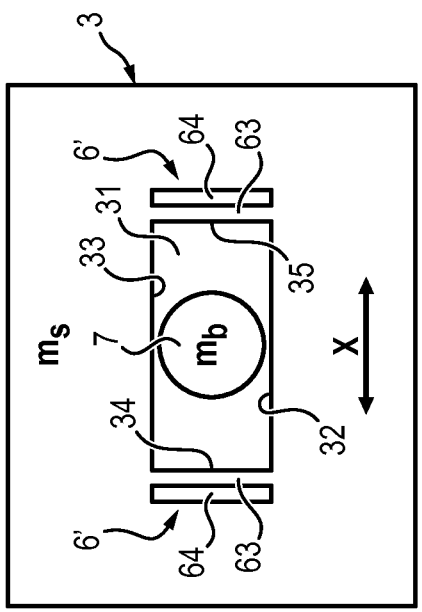

FIG. 18 illustrates a rectangular cavity 31 having dimensions (length and width) greater than dimensions of the second element 7, so that the second element 7 may freely move within the cavity 31 relative to the first element 3 in two perpendicular directions X and Y.

In addition, the device comprises four elastic stoppers 6' and 6" arranged between the first element 3 and the second element 7. Two elastic stoppers 6' are arranged for limiting movement of the second element 7 relative to the first element 3 in the first direction X. The other two elastic stoppers 6" are arranged for limiting movement of the second element 7 relative to the first element in the second direction Y.

The first elastic stoppers 6' comprise first beams 63 formed in the first element 3. The first beams 63 are positioned along the transversal walls 34 and 35. The first beams 63 extend transversally relative to the direction X. Each first beam 63 may be obtained by providing a slot 64 in the layer of conductor, the slot 64 extending parallel to the transversal walls 34, 35 of the first element 3.

The second elastic stoppers 6" comprise second beams 65 formed in the first element 3. The beams 65 are positioned along the longitudinal walls 32 and 33. The second beams 65 extend transversally relative to the direction Y. Each second beam 65 may be obtained by providing a slot 66 in the layer of conductor, the slot 66 extending parallel to the longitudinal walls 32 and 33 of the first element 3.

Figure 19:
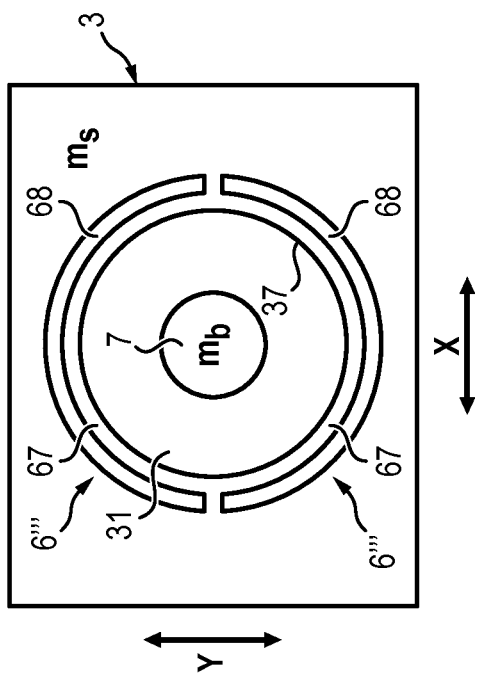

FIG. 19 illustrates a circular cavity 31 having a diameter which is greater than dimensions of the second element 7, so that the second element 7 may freely move within the cavity 31 relative to the first element 3 in two perpendicular directions X and Y.

The device 1 also comprises two elastic stoppers 6''' arranged along the walls of the circular cavity 31. Each elastic stopper 6''' comprises a curved beam 67 extending along a circular wall 37 surrounding the cavity 31. The beams 67 may be obtained by providing two arcuate slots 68 in the layer of conductor forming the first element 3.

Figure 20:
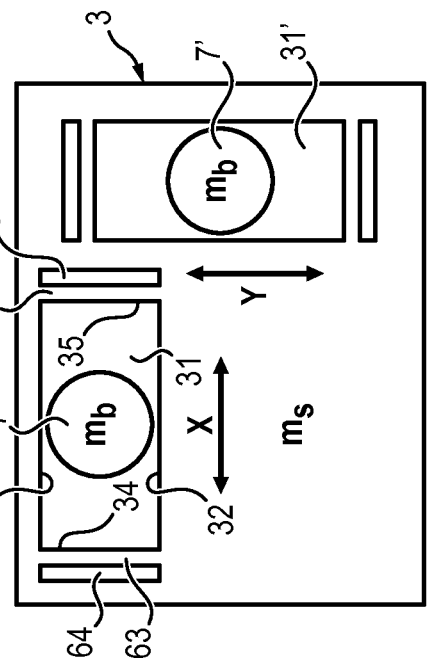

FIG. 20 shows a first element 3 having two cavities 31 and 31' which are both rectilinear. The cavities 31 and 31' are perpendicular to each other and oriented for guiding two second elements 7 and 7' according to two respective perpendicular directions of motion. One of the second element 7 is guided along a direction which is parallel to the direction X of oscillation of the first element 3. The other second element 7' is guided along a direction Y which is perpendicular to the direction X of oscillation of the first element 3.

Figure 21:
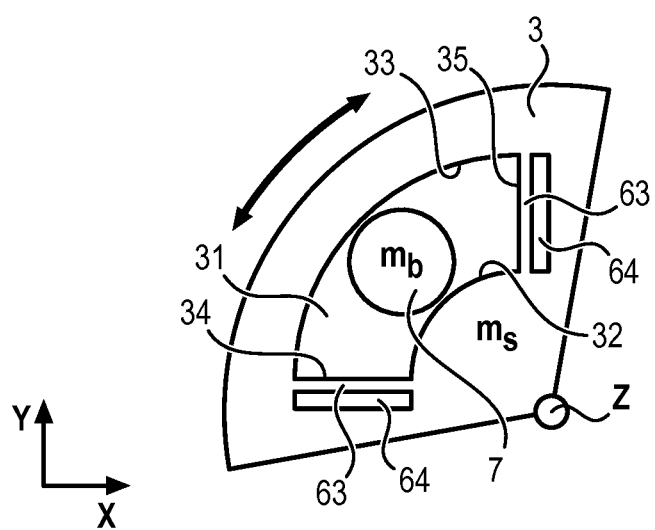

FIG. 21 shows a first element 3 which is able to oscillate relative to the support 2 by rotation around an axis Z, which is perpendicular to directions X and Y. The first element 3 has an arcuate cavity 31. The arcuate cavity 31 is delimited by curved walls 32 and 33, so that the second element 7 is guided within the cavity 31 relative to the first element 3 along a circular path. More precisely, each wall 32 and 33 of the cavity 31 has a shape of a portion of cylindrical surface. The difference between the radius of wall 33 and the radius of wall 32 (measured from axis Z) is substantially equal to the diameter of the second element 7.

Figure 22:
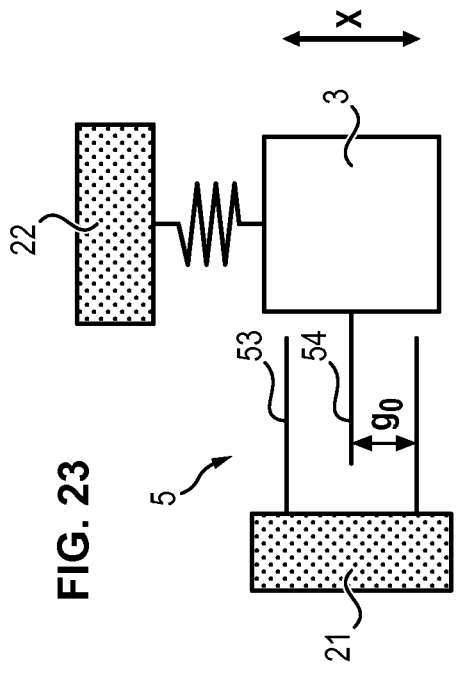
FIGS. 22 to 25 are schematic views of different electrostatic transducers.

FIGS. 22 to 25 are schematic views of different electrostatic transducers 5, FIG. 22 shows an electrostatic transducer 5' having electrodes 53', 54' extending along a direction parallel to the direction X of oscillation of the first element 3 relative to the support 2. Oscillation of the first element 3 relative to the support 2, in the direction X causes oscillation of the second electrodes 54' relative to the first electrodes 53' in a direction parallel to the electrodes, thus causing variation of the overlapping areas $a_0$ of the electrodes, thereby causing variation of the capacitance of the capacitor.

Figure 23:
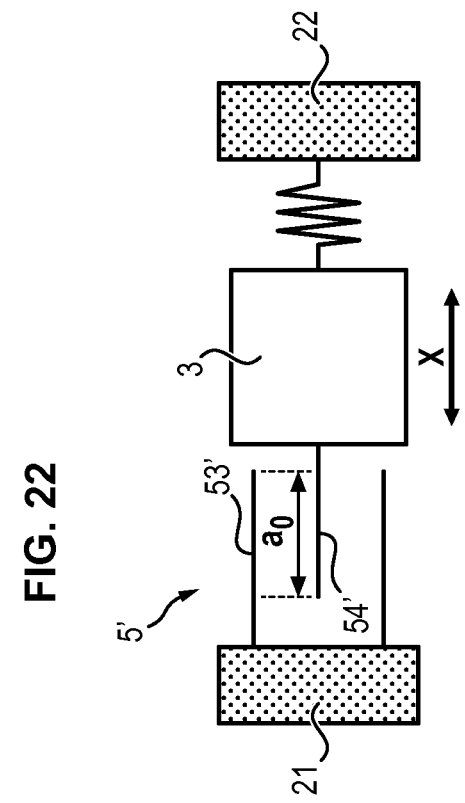

FIG. 23 shows an electrostatic transducer 5 having electrodes 53, 54 extending along a direction perpendicular to the direction X of oscillation of the first element 3 relative to the support 2. Oscillation of the first element 3 relative to the support 2, in the direction X, causes oscillation of the second electrodes 54 relative to the first electrodes 53 in a direction perpendicular to the electrodes, thus causing variation of the gap $g_0$ existing between the first electrodes 53 and the second electrodes 54, thereby causing variation of the capacitance of the capacitor.

Figure 24:
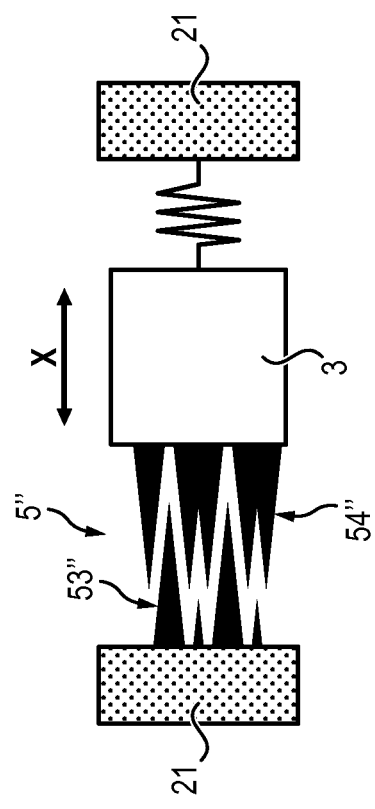

FIG. 24 shows an electrostatic transducer 5'' comprising electrodes 53'', 54'', each electrode 53'', 54'' having a triangular shape. Oscillation of the first element 3 relative to the support 2 causes both variation of the gap $g_0$ existing between the electrodes and variation of the overlapping areas $a_0$ of the electrodes.

Figure 25:
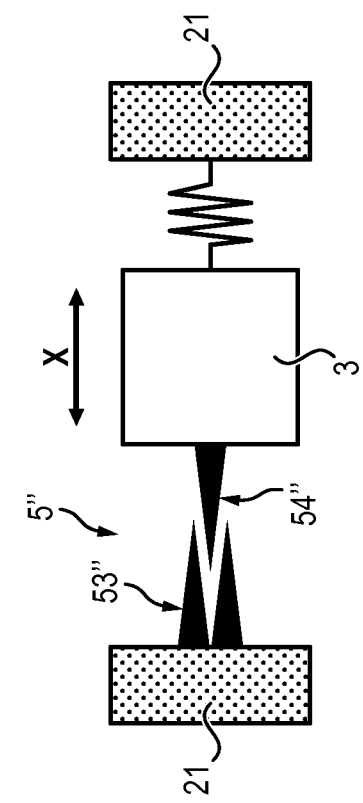

FIG. 25 shows an electrostatic transducer 5'' comprising electrodes 53''' and 54''', each electrode having a fractal shape of the first order, based on a triangular pattern. Oscillation of the first element 3 relative to the support 2 causes both variation of the gap $g_0$ existing between the electrodes and variation of the overlapping areas $a_0$ of the electrodes. The fractal shape allows maximizing variation of the capacitance of the capacitor.

Figure 26:
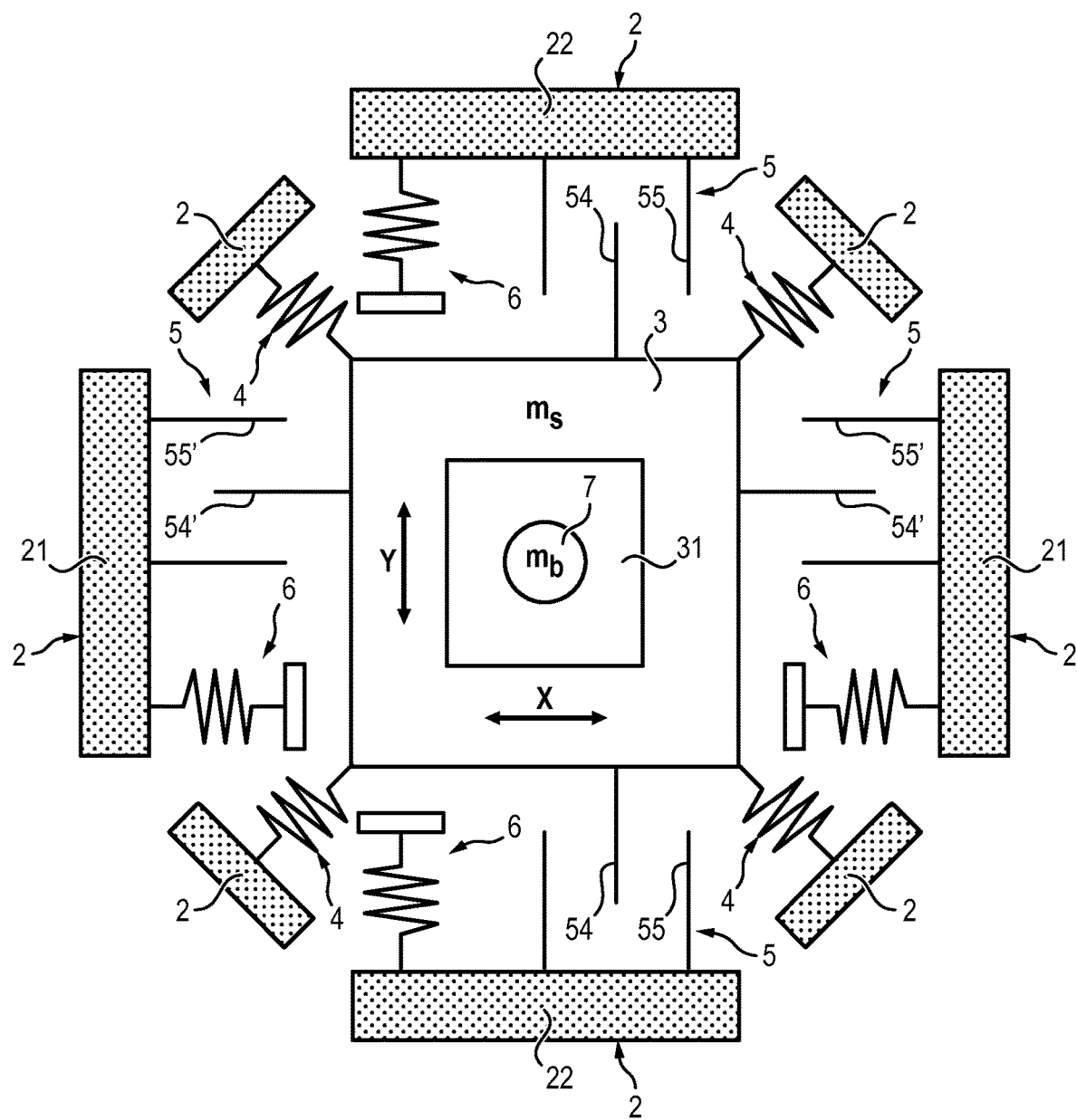
FIG. 26 is a schematic diagram showing a miniature kinetic energy harvester according to a seventh embodiment of the invention.

FIG. 26 is a schematic diagram showing a miniature kinetic energy harvester 1 according to a seventh embodiment of the invention, In this seventh embodiment, the first element 3 surrounds a rectangular cavity 31 having dimensions (length and width) greater than dimensions of the second element 7, so that the second element 7 may freely move within the cavity 31 relative to the first element 3 in two perpendicular directions X and Y.

In addition, the first element 3 is suspended or linked to the support 2 by springs 4. The springs 4 are arranged so that the first element 3 is movable relative to the support 2 according to two perpendicular directions of oscillation X and Y. More precisely, the device 1 comprises four springs 4, each spring 4 connecting one corner of the first element 3 to the support. Each spring 4 extends at 45° relative to the X and Y directions.

The device 1 also comprises four electrostatic transducers 5 and 5' arranged between the first element 3 and the support 2. The electrostatic transducers include two first electrostatic transducers 5 having electrodes 54 and 55 extending along a direction parallel to the direction Y, and two second electrostatic transducers 5'' having electrodes 54' and 55' extending along a direction parallel to the direction X.

Oscillation of the first element 3 relative to the support 2 in the direction X causes oscillation of the second electrodes 54 relative to the first electrodes 53 in a direction perpendicular to the electrodes 53, 54, thereby causing variation of the capacitance of the first electrostatic transducers 5. This also causes oscillation of the second electrodes 54' relative to the first electrodes 53' in a direction parallel to the electrodes 53', 54', thereby causing variation of the capacitance of the second electrostatic transducers 5.

Similarly, oscillation of the first element 3 relative to the support 2 in the direction Y causes oscillation of the second electrodes 54 relative to the first electrodes 53 in a direction parallel to the electrodes 53, 54, thereby causing variation of the capacitance of the first electrostatic transducers 5. This also causes oscillation of the second electrodes 54' relative to the first electrodes 53' in a direction perpendicular to the electrodes 53', 54', thereby causing variation of the capacitance of the second electrostatic transducers 5.

The device 1 also comprises elastic stoppers 6 arranged between the support 2 and the first element 3 for limiting travel of the first element according to both directions of oscillation X and Y.

Figure 27:
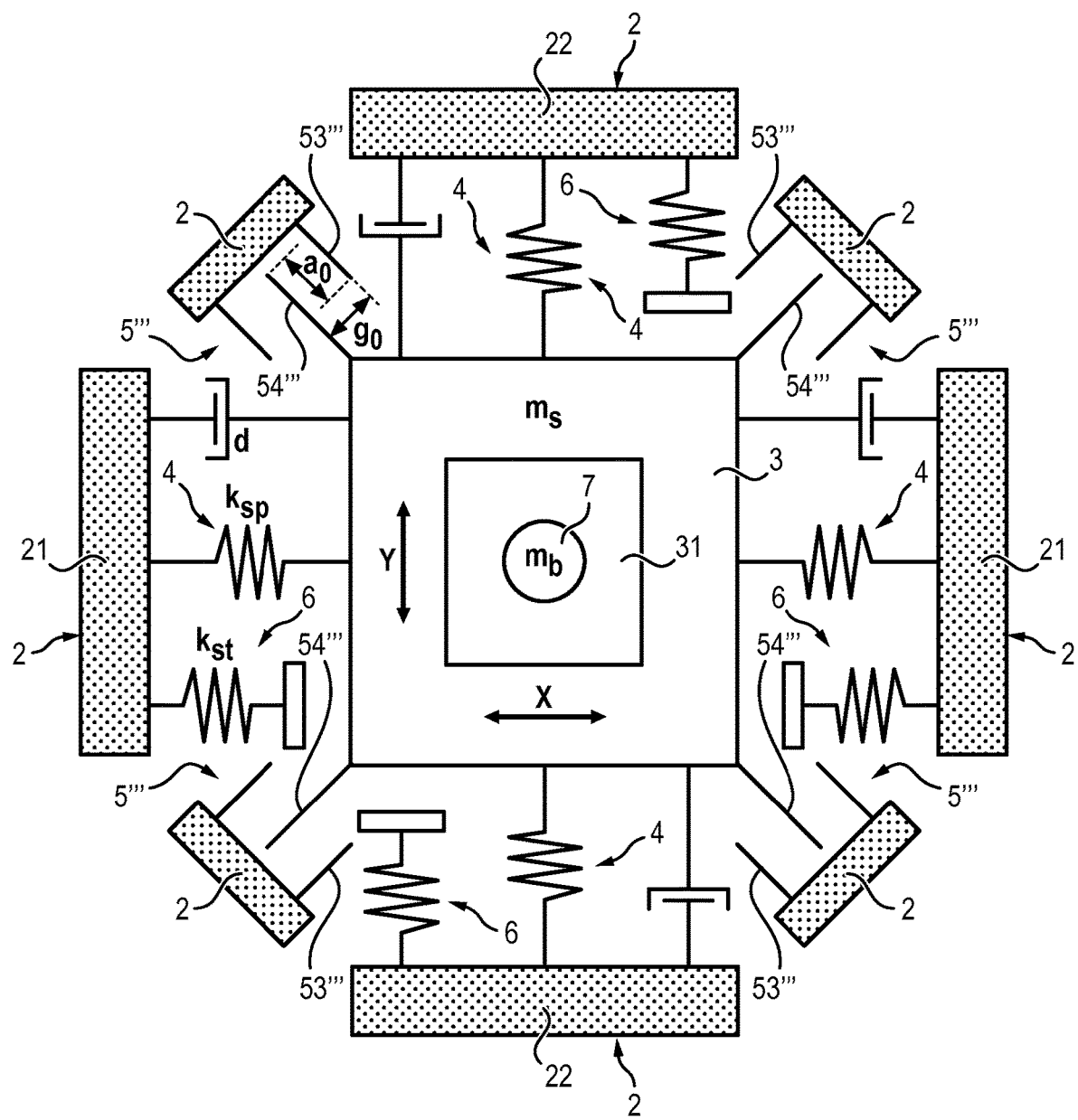
FIG. 27 is a schematic diagram showing a miniature kinetic energy harvester according to a seventh embodiment of the invention.

FIG. 27 is a schematic diagram showing a miniature kinetic energy harvester according to a seventh embodiment of the invention. As in the seventh embodiment, the first element 3 surrounds a rectangular cavity 31 having dimensions (length and width) greater than dimensions of the second element 7, so that the second element 7 may freely move within the cavity 31 relative to the first element 3 in two perpendicular directions X and Y.

The first element 3 is suspended or linked to the support 2 by springs 4. The springs 4 are arranged so that the first element 3 is movable relative to the support 2 according to two perpendicular directions of oscillation X and Y. More precisely, the device 1 comprises four springs 4, each spring 4 connecting one side of the first element 3 to the support.

The device 1 also comprises four electrostatic transducers 5''' arranged between the first element 3 and the support 2. Each electrostatic transducer 5''' has first electrodes 53''' (or fixed electrodes) fixedly mounted to the support 2, and second electrodes 54''' (or mobile electrodes) fixedly mounted to the first element 3. Each second electrode 54''' extends from one of the corners of the first element 3.

The first and second electrodes 53''' and 54''' extend at 45° relative to directions X and Y.

In such an arrangement, when the first element 3 is brought into oscillation relative to the support 2 either direction X or Y, the second electrodes 54''' oscillates relative to the first electrodes 53''' so as to cause both variation of the gap $g_0$ existing between the electrodes and variation of the overlapping areas $a_0$ of the electrodes, thereby causing variation of the capacitance of the electrostatic transducers 5'''.

The invention claimed is:

1. A miniature kinetic energy harvester for generating electrical energy, comprising:
   a support,
   a planar first element,
   a cavity formed in a plane of the first element, wherein the cavity is defined by interior walls of the first element,
   at least one spring positioned in the plane of the first element and mounted between the first element and the support, the spring being arranged to cause the first element to oscillate in at least one direction of oscillation parallel to the plane of the first element,
   a transducer positioned in the plane of the first element between the first element and the support, wherein the transducer is configured to convert oscillation of the first element in the at least one direction of oscillation into an electrical signal, and
   at least one second element housed within the cavity and configured to freely move within the cavity so as to impact the interior walls of the first element when the harvester is subjected to vibrations, wherein the at least one second element contacting the walls of the first element causes the first element to oscillate in at least one direction of oscillation.

2. The miniature kinetic energy harvester of claim 1, wherein the first element has a first natural frequency of oscillation, and the second element is adapted for being set into motion when the harvester is subjected to vibrations having a second frequency of oscillation, which is lower than the first natural frequency, wherein the second element is configured to cause the first element to oscillate at the first frequency when the second element subjected to vibrations having the second frequency.

3. The miniature kinetic energy harvester of claim 1, wherein the transducer is a MEMS transducer.

4. The miniature kinetic energy harvester of claim 1, comprising elastic stoppers arranged between the support and the first element for limiting travel of the first element according to its direction of oscillation.

5. The miniature kinetic energy harvester of claim 4, wherein the elastic stoppers comprises non-linear springs.

6. The miniature kinetic energy harvester of claim 4, wherein one of the elastic stoppers comprises a beam formed in the support or in the first element, the beam being obtained by providing a slot in a layer of material forming the support or the first element.

7. The miniature kinetic energy harvester of claim 1, comprising elastic stoppers arranged between the first element and the second element for limiting travel of the second element relative to the first element.

8. The miniature kinetic energy harvester of claim 1, wherein the cavity is a rectangular slot and wherein a length of the rectangular slot is formed along the direction of oscillation so as to guide the second element along the direction of oscillation.

9. The miniature kinetic energy harvester of claim 1, wherein the first element may be brought into oscillation relative to the support according to at least two directions of oscillation.

10. The miniature kinetic energy harvester of claim 1, comprising a bottom cover and a top cover fixed to the support so as to form a housing enclosing the first element, the spring, the second element and the transducer.

11. The miniature kinetic energy harvester of claim 10, wherein each of the bottom cover and the top cover has a surface forming a recess, so that the bottom cover and the top cover are not in contact with the first element, the spring and the transducer.

12. The miniature kinetic energy harvester of claim 1, wherein the transducer is an electrostatic transducer comprising a capacitor having a first electrode fixed to the support and a second electrode fixed to the first element, and wherein oscillation of the first element relative to the support causes oscillation of the second electrode relative to the first electrode thereby causing variation of a capacitance of the capacitor.

13. The miniature kinetic energy harvester of claim 1, wherein the second element is a ball.

14. The miniature kinetic energy harvester of claim 1, wherein the support surrounds the first element.

15. The miniature kinetic energy harvester of claim 1, comprising two rectilinear cavities, the cavities extending perpendicular to each other, and being oriented for guiding two second elements, one of the second elements being guided along a direction which is parallel to the direction of oscillation of the first element, the other second element being guided along a direction which is perpendicular to the direction of oscillation of the first element.

16. The miniature kinetic energy harvester of claim 1, wherein each of the support, the first element, the spring and the transducer are etched from a single layer of conducting material.

17. The miniature kinetic energy harvester of claim 1, wherein the miniature kinetic energy harvester has a length and a width of less than 2 centimeters, and a thickness of less than 0.5 centimeters.

18. The miniature kinetic energy harvester of claim 1, wherein motion of the second element is restricted to the plane of the first element.

19. The miniature kinetic energy harvester of claim 2, wherein the first frequency is greater than 90 Hz, and wherein the second frequency is less than 60 Hz.

* * * * *